(12) United States Patent
Murota et al.

(10) Patent No.: US 8,980,443 B2
(45) Date of Patent: Mar. 17, 2015

(54) ORGANIC ELECTROLUMINESCENT ELEMENT

(75) Inventors: Kazutoshi Murota, Hino (JP); Toshihiko Iwasaki, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 747 days.

(21) Appl. No.: 13/257,776

(22) PCT Filed: Apr. 14, 2010

(86) PCT No.: PCT/JP2010/056672
§ 371 (c)(1),
(2), (4) Date: Sep. 20, 2011

(87) PCT Pub. No.: WO2010/119891
PCT Pub. Date: Oct. 21, 2010

(65) Prior Publication Data
US 2012/0007072 A1    Jan. 12, 2012

(30) Foreign Application Priority Data
Apr. 14, 2009   (JP) .................................. 2009-097972

(51) Int. Cl.
*H01L 51/50*     (2006.01)
*H01L 51/00*     (2006.01)
*C08G 61/12*     (2006.01)

(52) U.S. Cl.
CPC ............ *H01L 51/0035* (2013.01); *C08G 61/12* (2013.01); *H01L 51/0085* (2013.01); *C08G 2261/512* (2013.01); *C08G 2261/522* (2013.01);
(Continued)

(58) Field of Classification Search
None
See application file for complete search history.

(56) References Cited

U.S. PATENT DOCUMENTS

| 6,630,566 | B1 | 10/2003 | Allen et al. | |
| 2006/0280966 | A1* | 12/2006 | Otsu et al. | 428/690 |
| 2009/0284134 | A1* | 11/2009 | Iida et al. | 313/504 |

FOREIGN PATENT DOCUMENTS

| JP | 7-41759 A | 2/1995 |
| JP | 10-308280 A | 11/1998 |
| JP | 2004-265672 A | 9/2004 |
| JP | 2004-292782 A | 10/2004 |
| JP | 2006-41395 A | 2/2006 |

(Continued)

*Primary Examiner* — Gregory Clark
(74) *Attorney, Agent, or Firm* — Holtz, Holtz, Goodman & Chick PC

(57) ABSTRACT

Disclosed is an organic electroluminescent element which can be produced by a wet process, has improved laminated structure, and also has improved external quantum efficiency and an improved service life. The organic electroluminescent element comprises at least an anode; a cathode and a laminated structure intercalated between the anode and the cathode, all of which are arranged on a substrate, wherein the laminated structure has at least four layers formed by a wet process, and wherein the layers produced by the wet process include at least a hole injection layer, a hole transport layer and a light-emitting layer. The organic electroluminescent element is characterized in that the hole injection layer comprises an electrically conductive polymer, the hole transport layer comprises a polymeric compound having a repeating unit represented by general formula (1), and the polymeric compound has a weight average molecular weight of 50,000 to 200,000 in terms of polystyrene content.

20 Claims, 1 Drawing Sheet

(52) U.S. Cl.
CPC ....... *C08G 2261/598* (2013.01); *H01L 51/0043* (2013.01); *H01L 51/0084* (2013.01); *H01L51/5048* (2013.01); *H01L 51/5088* (2013.01); *H01L 2251/558* (2013.01); *Y10S 428/917* (2013.01)

USPC ........... 428/690; 428/917; 313/504; 313/505; 313/506; 257/40; 257/E51.05; 257/E51.026; 257/E51.032; 564/26; 564/426; 564/432; 564/434; 528/394; 528/397; 528/422

(56) References Cited

FOREIGN PATENT DOCUMENTS

| | | |
|---|---|---|
| JP | 2006-316280 A | 11/2006 |
| JP | 2008-280385 A | 11/2008 |
| JP | 2009-59767 A | 3/2009 |
| WO | WO 2006/095553 A1 | 9/2006 |
| WO | WO 2008/146838 A1 | 12/2008 |
| WO | WO 2009/063850 A1 | 5/2009 |

\* cited by examiner

LIGHT

LIGHT

ORGANIC ELECTROLUMINESCENT ELEMENT

This application is the United States national phase application of International Application PCT/JP2010/056672 filed Apr. 14, 2010.

TECHNICAL FIELD

The present invention relates to an organic electroluminescence element

BACKGROUND

Conventionally, an emission type electronic display device includes an electroluminescence display (hereinafter, referred to as an ELD). A constituent element of an ELD includes such as an inorganic electroluminescence element (hereinafter, referred to as an inorganic EL element) and an organic electroluminescence element (hereinafter, referred to as an organic EL element).

An inorganic EL element has been utilized as a flat light source, however, it requires a high voltage of alternating current to operate an emission element On the other hand, an organic EL element is an element provided with a constitution comprising an light emitting layer containing a light emitting substance being sandwiched with a cathode and an anode, and an exciton is generated by an electron and a hole being injected into the emitting layer to be recombined, resulting light emission utilizing light release (fluorescence-phosphorescence) at the time of deactivation of said exciton; the light emission is possible at a voltage of approximately a few to a few tens volts, and an organic EL element is attracting attention with respect to such as superior viewing angle and high visual recognition due to a self-emission type as well as space saving and portability due to a completely solid element of a thin layer type.

Moreover, an organic EL device has a distinctive feature of being a surface light, which is different from the main light sources, for example, a light-emitting diode and a cold cathode tube having been conventionally used. As applications which can effectively utilize this property, there are a light source for illumination and a back light of various displays. Especially, it is suitable to use as a back light of a liquid crystal full color display the demand of which has been increased remarkably in recent years.

When an organic EL element is used as a light source for illumination or a back light of a display, the used light source is required to emit a white light or an electric bulb color (hereafter they are called as a white color).

The following ways are known to achieve in obtaining a white light: a method to laminate B/G/R three light emitting layers or B/Y two light emitting layers which are in complementary color relation (for example, refer to Patent document 1); a method in which multicolor emission pixels, for example, three color of blue, green, and red, are provided by coating separately, and these pixels are made to emit a light simultaneously to obtain a white light by mixing (for example, a combination of a blue luminescent material and a color conversion fluorescent dye); and a method of adjusting several luminescent materials each having a different emission wavelength in one element to obtain a white light by mixing.

However, there was a problem that a luminescent color will change when laminating a plurality light emitting layers each emitting a different color light, because a light-emitting position would shift by the change of the driving electric current or by the chronological change in continuous driving. Moreover, the method of providing multicolor emission pixels by coating separately has a problem of using complicated manufacturing processes, such as positioning a mask, and its production yield is not good. Further, there is a problem that luminous efficiency is low by a color conversion mode.

A method of stopping the slippage of a light-emitting position is proposed to resolve these problems by making all the luminescent materials intermingled in a single light emitting layer. However, if luminescent materials are intermingled, energy transfer will occur by the difference in the luminescence energy level of each luminescent material.

Moreover, there is described a method of improving efficiency using the energy transfer between the luminescent materials which exist together in the same layer (for example, refer to Patent document 2). However, according to this method, even if the luminescent materials in which luminescent colors differ are mixed, only one luminescent material emits light, and it is not suitable for obtaining a white light.

That is, in order to obtain desirable white luminescence by a single light emitting layer, white luminescence cannot be obtained by making the ratio of the luminescent materials to be the same as incorporated in a multilayered constitution. The content of the luminescent material having a low luminescence energy level must be adjusted to be a small quantity compared to the content of the luminescent material having a high luminescence energy level, and control of material ratio is difficult when the element is produced by a vacuum evaporation.

On the other hand, as a production method of an organic EL element, there are wet processes (for example, a spin coat method, a cast method, an ink-jet method, a spray method, and a printing method). In recent years, a production method of a wet process has been attracted attention since it does not require a vacuum process and continuous production is easily done. In a wet process, it can be formed a light emitting layer having a desired composition by adjusting the material mixing ratio at the time of coating solution preparation. It has an advantage when the light emitting layer containing materials having greatly different mixing ratio is formed.

Moreover, using a polymer by a wet process in organic EL material is already known widely (for example, refer to Patent documents 3 and 4), and it is recognized as a useful technique. Furthermore, the organic electroluminescence element (it is also called an organic EL element) using a polymeric material having a specific weight average molecular weight is introduced as a well-known technique (for example, refer to Patent document 5).

By using a polymer as an organic EL material for a wet process with reference to these patent documents, it was thought that a very useful element would be obtained and development was investigated. However, it became clear that there was a new problem which was not disclosed in patent documents. That is, even if a polymer material was used, it was difficult to constitute the laminated structure continuously by a wet process. When the following layer is applied on a polymer material, a part of polymer material will be dissolved into the solvent used for the next application, and irregularity will arise in a membrane interface. The difference in the coating thickness by the irregularity affects the properties. When an electric current is passed in an element, a non-uniformity arises in electron flow, a rectification ratio becomes worse, and there will appear the phenomenon in which an element will not shine suddenly. Moreover, when a higher molecular weight was advanced too much in order to decrease the solubility in the solvent used for a next layer, it was suggested that there were deteriorate effects to external extraction quantum efficiency and a lifetime.

PRIOR ART DOCUMENTS

Patent Document

Patent document 1: Japanese Patent Application Publication (JP-A) No. 7-41759
Patent document 2: JP-A No. 2006-41395
Patent document 3: JP-A No. 10-308280
Patent document 4: JP-A No. 2001-527102
Patent document 5: JP-A No. 2004-292782

SUMMARY OF THE INVENTION

Problems to be Solved by the Invention

The present invention is made in view of the above-mentioned problems. An object of the present invention is to provide an organic EL element which resolves the problem of a laminated layer structure, and improves external extraction quantum efficiency and a lifetime in manufacturing an organic EL element using a wet process, Means to Solve the Problems An object of the present invention described above has been achieved by the following constitutions.
1. An organic electroluminescence element comprising a substrate having thereon at least an anode, a cathode and a laminated layer structure sandwiched between the anode and the cathode, provided that the laminated layer structure comprises at least four layers produced by a wet process, and a hole injection layer, a hole transport layer and a light emitting layer are contained in the four layers produced by a wet process,
wherein the hole injection layer contains a conductive polymer, the hole transport layer contains a polymer having a repeating unit represented by Formula (1), and the polymer has a weight average molecular weight of 50,000 to 200,000 as a polystyrene conversion value.

$$\left[\left(\!\!\!\begin{array}{c}Ar^1-N\\|\\Ar^2\end{array}\!\!\!\right)_{\!\!n1}\!\!\left(\!\!\!\begin{array}{c}Ar^3-N\\|\\Ar^4\end{array}\!\!\!\right)_{\!\!n2}\right] \quad \text{Formula (1)}$$

In the Formula, $Ar^1$ and $Ar^3$ each independently represent an arylene group which may have, and $Ar^1$ and $Ar^3$ each may be bonded through a joint group; $Ar^2$ and $Ar^4$ each independently represent an aryl group or an aromatic heterocyclic group which may have a substituent; n1 and n2 are integer of 0 to 2, provided that n1 and n2 are not simultaneously set to be 0.
2. The organic electroluminescence element of the aforesaid item 1,
wherein thickness T1 of the hole injection layer and thickness T2 of the hole transport layer satisfy the following expression.

$$T1 > T2 \quad \text{Expression}$$

3. The organic electroluminescence element of the aforesaid items 1 or 2,
wherein the light emitting layer contains a plurality of light emitting materials each having a different emitting light color, the plurality of light emitting materials have a light emission spectrum exhibiting at least two maximum emissions in the range of 420 to 650 nm and one minimum emission in the range of 480 to 510 nm.
4. The white light emitting organic electroluminescenc,e element of any one of the aforesaid items 1 to 3,
wherein the light g material contained in the light emitting layer has a molecular weight of 3,000 or less.
5. The organic electroluminescence element of any one of the aforesaid items 1 to 4,
wherein the light emitting material contained in the light emitting layer is a compound having at least one partial structure represented by any one of Formulas (3) to (5).

Formula (3)

In the Formula, Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

Formula (4)

In the Formula, Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent A1 represents a group of atoms necessary to form an aromatic hydrocarbon ring or an aromatic heterocycle; and M represents Ir or Pt.

Formula (5)

In the Formula, Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

6. The organic electroluminescence element of any one of the aforesaid items 1 to 5,
wherein a fluorinated alcohol is used in the step of forming the electron transport layer by a wet process.

Effects of the Invention

By the present invention, it has achieved to provide an organic EL element which can be manufactures stably by the wet process, and the obtained organic EL element emits light efficiently and has a long lifetime.

EMBODIMENTS TO CARRY OUT THE INVENTION

Figure 1:
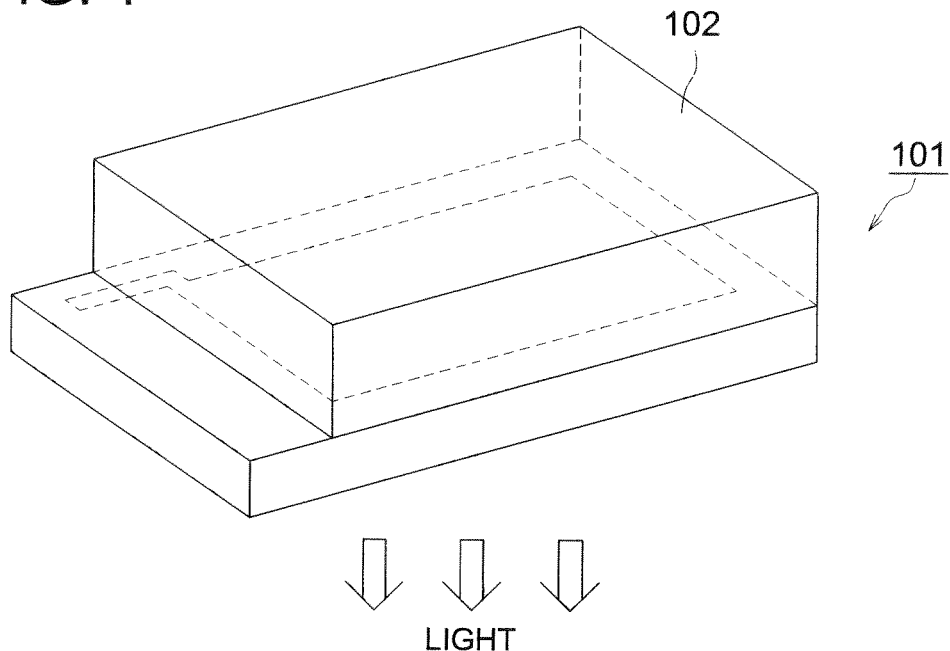
FIG. 1 is a schematic drawing of a lighting device.

The present inventors diligently investigated the way to resolve the aforesaid problems, and have accomplished the following present inventions. It was found that that the film formation property in a wet process was improved, and that external extraction quantum efficiency and a lifetime were improved by limiting the polymer used for a hole transport material in a hole transport layer to have a specific molecular weight range. Specifically, the weight average molecular weight of this polymer is 50,000 to 200,000 in polystyrene conversion. When the molecular weight is less than the under limit of this range, there is concern for mixing with other layers due to the high solubility into a solvent at the time of film formation. Moreover, even if film formation is performed, the luminescent efficiency does not go up by low molecular weight. When the molecular weight is less than the upper limit of this range, a problem arises by the difficulty of a synthesis and refining. Since the remaining impurity will be increased when the molecular weight distribution becomes large, the luminescent efficiency of an organic EL element, voltage, and a lifetime get worse.

Next, the present invention will be described in detail.
<Compound represented by Formula (1)>

The compounds represented by Formula (1) will be described.

In Formula (1), examples of an arylene group represented by $Ar^1$ and $Ar^3$, and which may have a substituent are: a phenylencgnup, and a biphenylene group. These groups may have a substituent such as a lower alkyl group or a lower alkoxyl group. Further, $Ar^1$ and $Ar^3$ each may be bonded through a joint group. Examples of a joint group are as follows.

—O—, —S—, —CH$_2$—, —CH$_2$CH$_2$—

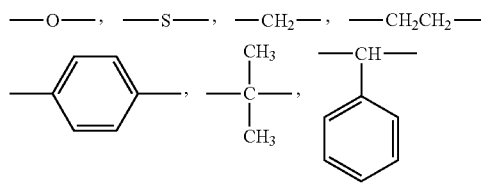

These are a divalent group. And "$Ar^1$ and $Ar^3$ each are bonded through a joint group" indicates as below when the joint group is —O— or —S—.

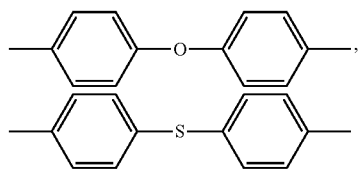

The bonding above is an example.
Preferable group of $Ar^1$ and $Ar^3$ are as follows.

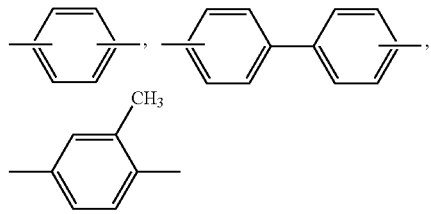

These are examples.

$Ar^2$ and $Ar^4$ each independently represent an aryl group (such as a phenyl group or a biphenyl group) or a heterocyclic group (such as a thienyl group or a furyl group), which may have a substituent. These groups may have a substituent such as an alkyl group or an alkoxyl group.

Preferably, $Ar^2$ and $Ar^4$ each independently represent a phenyl group, or a phenyl group having a substituent of an alkyl group or an alkoxyl group.

n1 represents an integer of 0 to 2, and more preferably n1 represents an integer of 0 to 1. n2 represents an integer of 0 to 2, and more preferably n2 represents an integer of 0 to 1. However, n1 and n2 are not simultaneously set to be 0.

Examples of a substituent which can be substituted Formula (1) include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group and an allyl group); an allcynyl group (for example, an ethynyl group and a proparyl group); an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyryl group); an aromatic heterocyclic group (for example, a pyridyl group, a pyrimidinyl group, a furyl group, a pyrrolyl group, an imidazolyl group, a benzoimidazolyl group, a pyrazolyl group, a pyradinyl group, a triazolyl group (for example, 1,2,4-triazole-1-yl group and 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring structure in which one of the carbon atoms constituting the carboline ring in the aforesaid carbolinyl group is replaced with a nitrogen atom), a quinoxalinyl group, a pyridazinyl group, a triazinyl group, a quinazolinyl group, and a phthalazinyl group), a quinoxalinyl group, a pyridazinyl group, a triazinyl group, a quinazolinyl group, a phthalazinyl group); a heterocyclic group (for example, a pyrrolidyl group, an imidazolidyl group, a morpholyl group, and an oxazolidyl group); an alkoxyl group (for example, a methoxy group, an ethoxy group, a propyloxy group, a pentyloxy group, an hexyloxy group, an octyloxy group, and a dodecyloxy group); a cycloalkoxy group (for example, a cyclopenyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkythio group (for example, a cyclopentylthio group and a cyclohexylthio group); an arylthio group (for example, a pheylthio group and a naphtylthio group) an alkoxycarbonyl group (for example, a methloxycarbonyl group, an ethyloxycarbonyl group, a butyloxycarbonyl group, an actyloxycarbonyl group, and a dodecyloxycarbonyl group); an aryloxycarbonyl group (for example, a phenyloxycarbonyl group and a naphtyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminiosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarnbonyl group, a phenylcarbonyl group, a naphthylcarbonyl group, and a pyridylcarbonyl group); an actyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylaminocarbonyl group, an octylcarbonylamino group, a dodecylcabonylamino group, a phenylcarbonylamino group, and a naphthylcarbonylamino group); a carbonyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octyluredi group, a dodecylureido group, a phenylureido group, a naphthylureido group, and a 2-oyridylaminoureido group); a sulfinyl group (for example, a methylsulfinyl group, an ethylfulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylarnino group, a dodecylamino group, an anilino group, a naphthylamino group, and a 2-pyridylamino group); a halogen atom (for example, a fluorine atom, a chlorine atom, and a bromine atom); a fluorinated hydrocarbon group (for example, a fluoromethyl group, a trifluoromethyl group, a pentafluoroethyl group, and a pentafluorophenyl group); a cyano group; a nitro group; a hydroxyl group; a mercapto group; a silyl group (for example, a trirnethylsilyl group, a triisopropylsilyl group, a triphenylsilyl group, and a phenyldiethylsilyl group) and a phosphono group.

Moreover, these substituents may be further substituted by the above-mentioned substituent. Further, a plurality of these substituents may combine with each other to Ruin a ring.

It is preferable that the compound concerning the present invention is end-capped Here, the end cap is described in details in Patent document 4, and the outline is as follows.

By adding an end-capping agent (compound which stops polymer growth) during a polymer synthesizing reaction, polymerization is controlled and it becomes possible to restrict further growth of a polymer chain. Therefore, when an end-capping agent is added excessively (for example, in a step which should stop polymerization), further growth of a polymer chain (and/or a polymer network when the polymer has a branch or a cross linkage bond) will be controlled substantially (for example, substantially stopped). Namely, an end-capping agent will give a terminal group to the polymer end so that coupling reaction does not substantially take place (for example, with other polymer precursor and/or other part of the polymer) under the polymerization condition. This terminal group will end-cap the polymer and block the portion where the polymer chain grows if it is not end-capped. Thus, it will function to substantially reduce (preferably, stop) the possibility of further polymerization. In the compound concerning the present invention, it is preferable that from 60% to substantially all of the polymerizable portions are blocked with at least one terminal substituent. More preferably, substantially all polymerizable portions are blocked (as an example). In another still more preferable case, about 60% to about 90% of these portions are blocked. About the examples of an end capping agent, there can be cited the examples listed in Patent document 4 and Patent document 5.

It is preferable that the polymer containing a repeating unit represented by Formula (1) is composed of the repeating unit represented by Formula (1) substantially in an amount of 90 mass% or more, from the viewpoint of exhibiting the effects of the present invention.

As the polymer containing a repeating unit represented by Formula (1), the following compounds can be cited. However, these compounds don't limit the scope of the present invention.

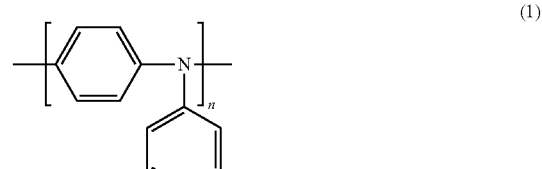

(1)

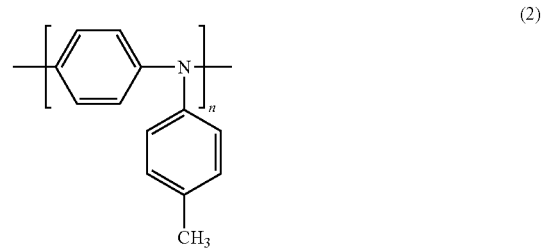

(2)

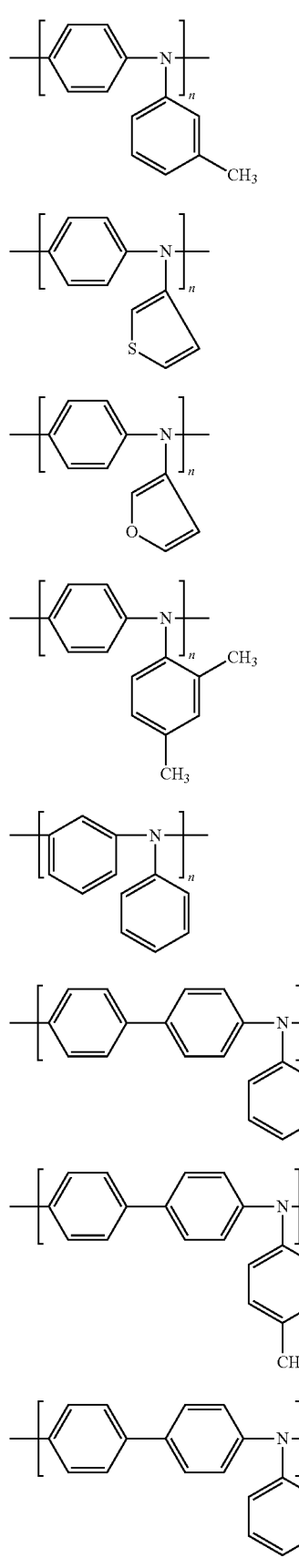
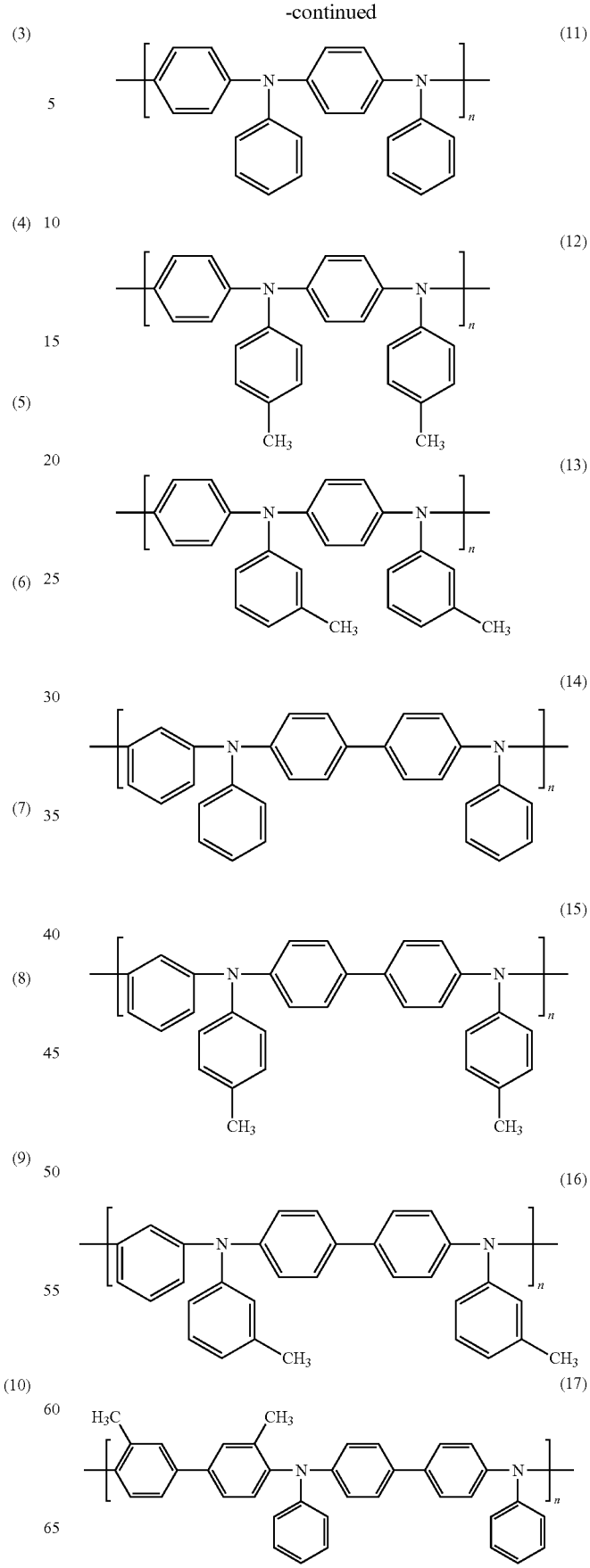

(18) 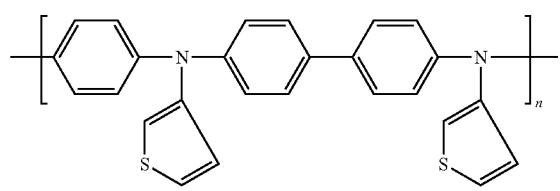
(19) 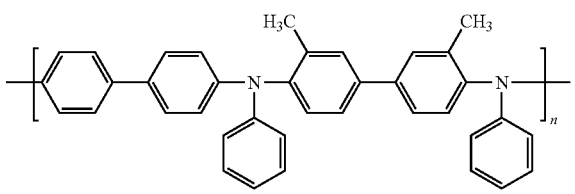
(20) 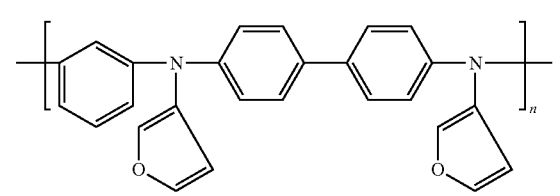
(21) 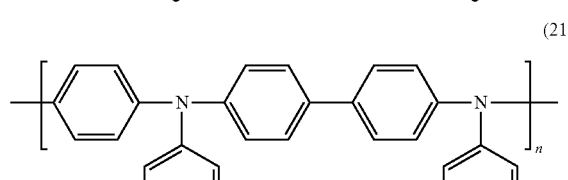
(22) 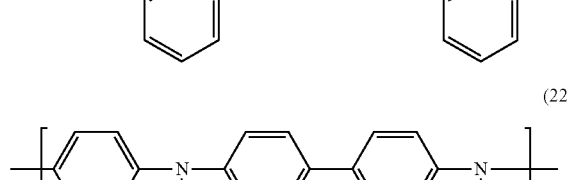
(23) 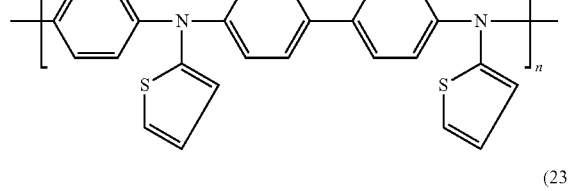
(24) 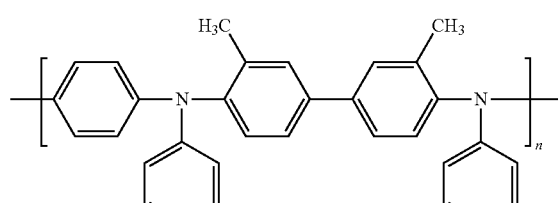
(25) 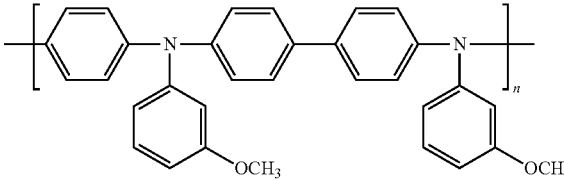
(26) 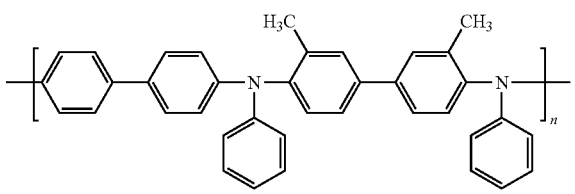
(27) 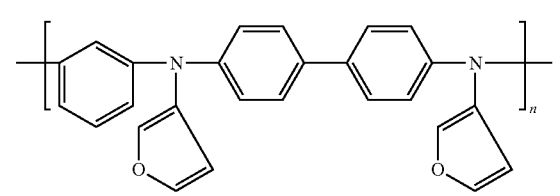
(28) 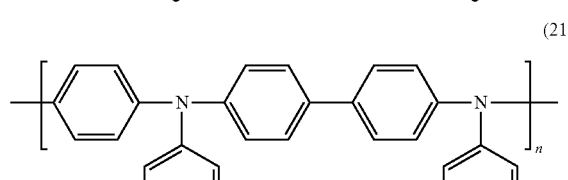
(29) 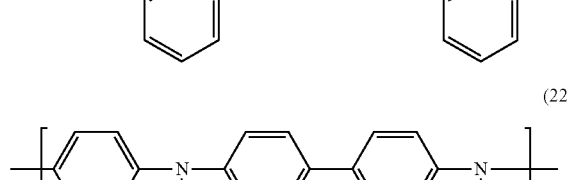
(30) 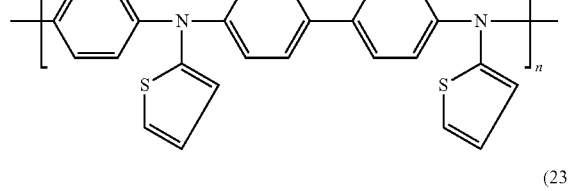
(31) 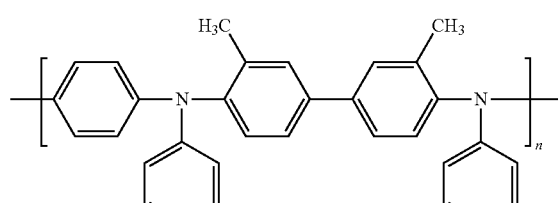

(32)
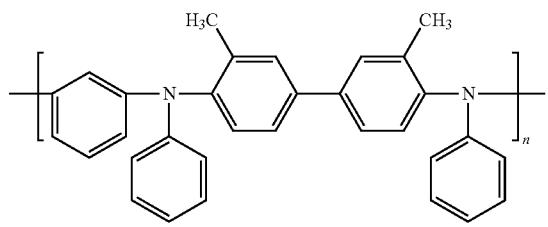
(33)
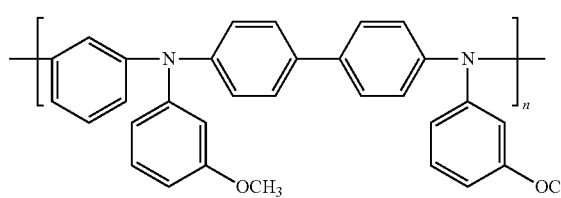
(34)
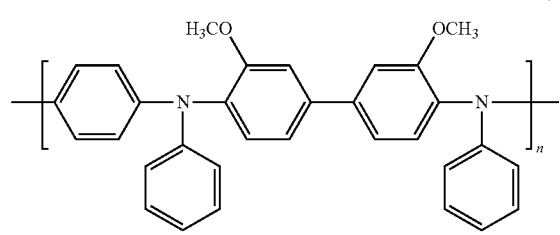
(35)
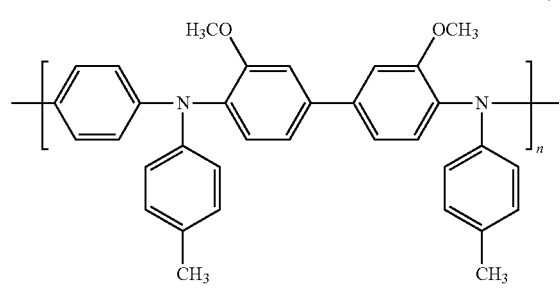
(36)
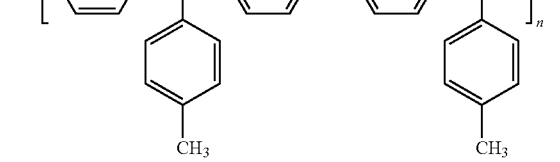
(37)
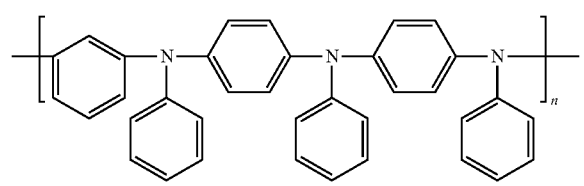
(38)
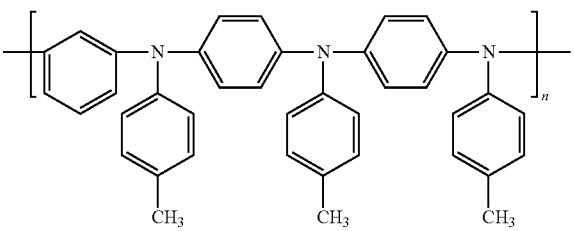
(39)
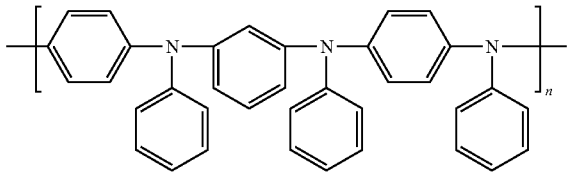
(40)
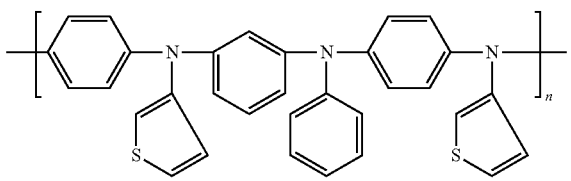
(41)
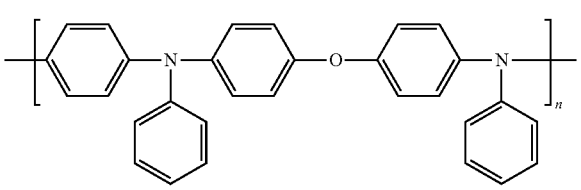
(42)
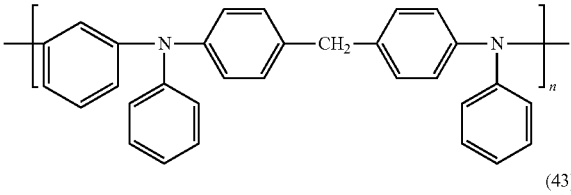
(43)
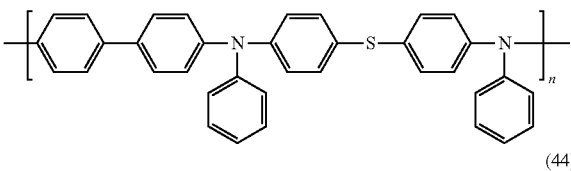
(44)
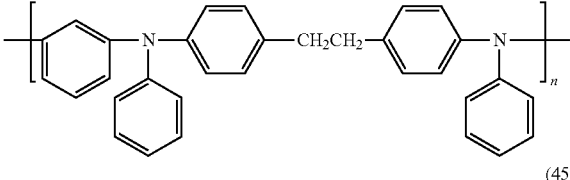
(45)
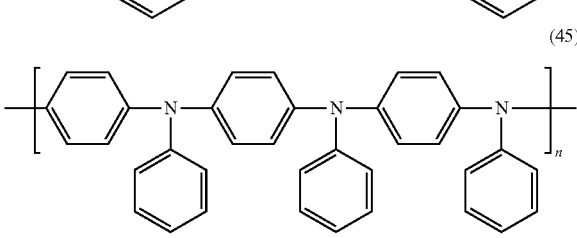

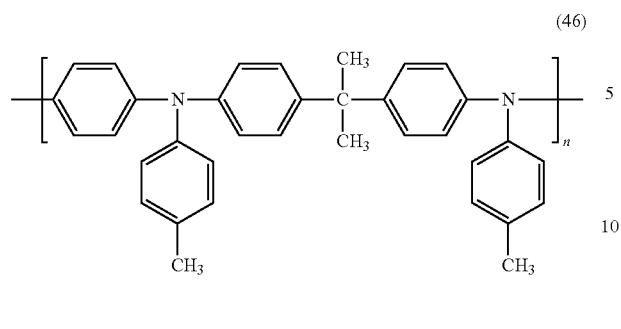
(46)
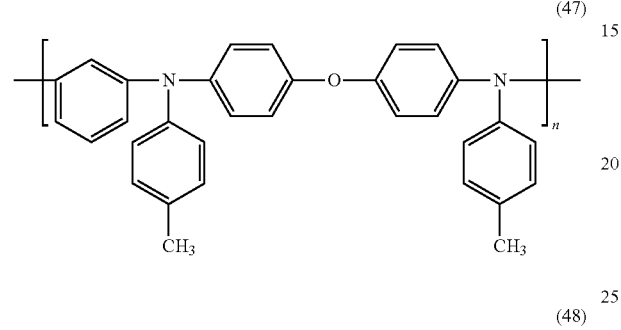
(47)
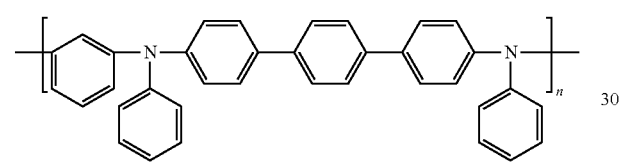
(48)
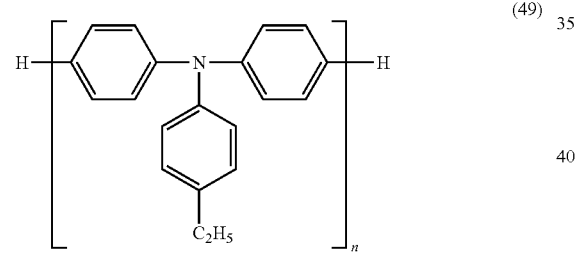
(49)
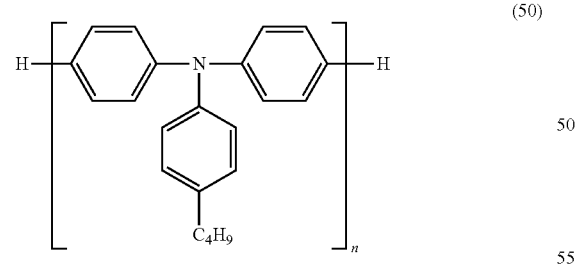
(50)
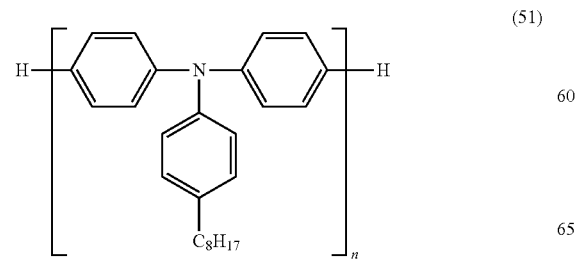
(51)
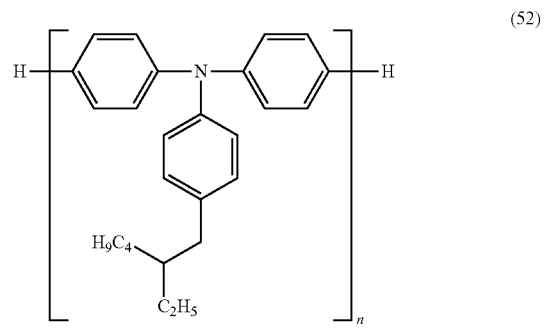
(52)
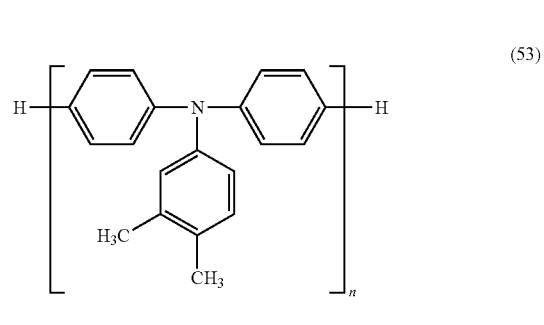
(53)
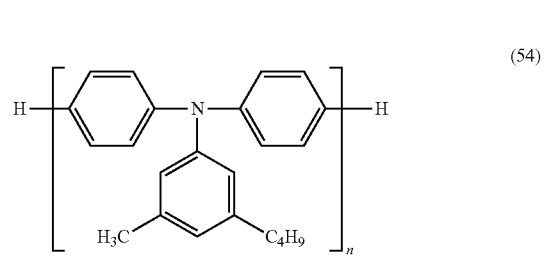
(54)
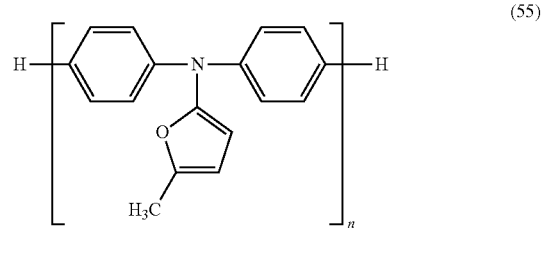
(55)
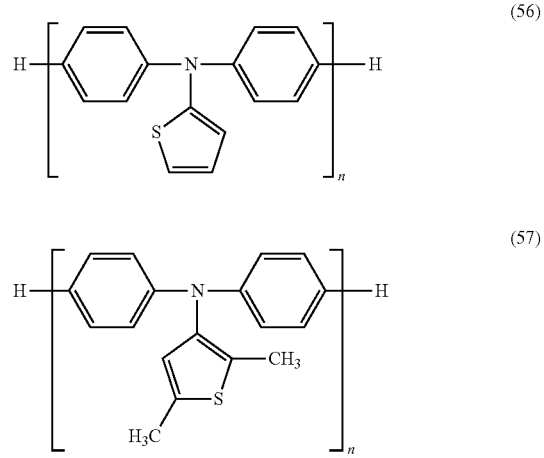
(56)
(57)

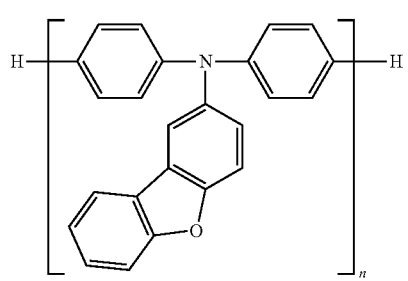

(58)

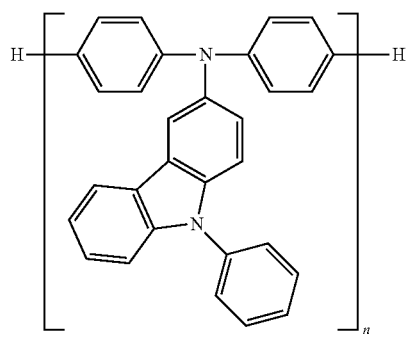

(59)

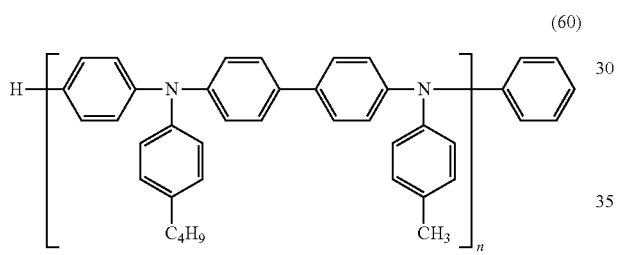

(60)

The weight average molecular weight of the polymer which has a repeating unit represented by Formula (1) is 50,000 to 200,000, and it is more preferably 50,000 to 80,000 in polystyrene conversion. When the molecular weight is less than the under limit of this range, there is concern for mixing with other layers due to the high solubility into a solvent at the time of film formation. Moreover, even if film formation is performed, the luminescent efficiency does not go up by low molecular weight. When the molecular weight is less than the upper limit of this range, a problem arises by the difficulty of a synthesis and refining. Since the remaining impurity will be increased when the molecular weight distribution becomes large, the luminescent efficiency of an organic EL element, voltage, and a lifetime get worse.

The weight average molecular weight can be measured by a gel permeation chromatography (GPC) method using tetrahydrofuran (THF) as a column solvent.

As a measuring method of a weight average molecular weight of a polymer by GPC (gel permeation chromatography), a measuring sample is dissolved in tetrahydrofuran so that it may become the concentration of 1 mg/ml. As a dissolving condition, the sample is subjected to a treatment of an ultrasonic homogenizer for 5 minutes at room temperature. Subsequently, after processing with a membrane filter having a pore size 0.2 μm, a 10 μL sample solution is injected in GPC. An example of the measurement requirements of GPC is shown below.

Apparatus: HLC-8220 (made by TOSOH)
Column: G4000 $H_{XL}$-G3000 $H_{XL}$-G2000 $H_{XL}$-G2000$H_{XL}$ (made by TOSOH)
Column temperature: 40° C.
Solvent: Tetrahydrofuran
The flow rate: 0.2 ml/min
Detector: Refractive index detector (RI detector)

The determination of a molecular weight of a sample is computed based on a molecular weight distribution derived from a calibration curve created with monodisperse polystyrene standard particles. It is preferable to use about ten points of polystyrene for producing a calibration curve.

A polymer containing a repeating unit represented by Formula (1) can be prepared by the well-known method described in, such as Malcromol. Chem., 193, page 909 (1992).

Synthetic Example 1

<Synthesis of Compound 50>

Compound 50 was synthesized according to the following scheme.

Synthetic Example

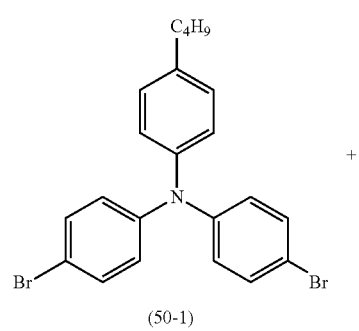

(50-1)

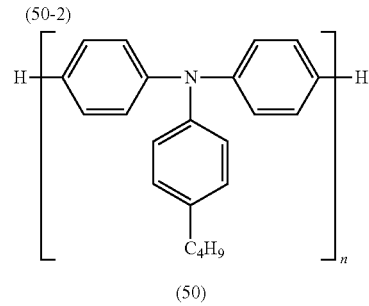

(50-2)

(50)

15.0 g of Compound 50-1 and 18.0 g of Compound 50-2 were dissolved in 200 ml of toluene, then under a nitrogen gas, were added 1.0 g of Aliquat 336 and 30 ml of 2 mol/L sodium hydrogencarbonate solution. This mixture was vigorously stirred, and was heated to reflux for 2 hours. Then, after added 1.0 g of bromobenzene, the mixture was heated for 5 hours. The reaction solution was cooled to 60° C., and it was added gently to a mixture solution of 3 L of methanol and 300 ml of pure water while stirring. The produced precipitated material was filtered, and it was washed repeatedly with methanol and pure water, then it was dried in a vacuum oven at 60° C. for 10 hours to obtain compound 50a (yield: 19.0 g; weight average molecular weight: 5,000). The spectroscopic characteristics of compound 50a corresponded to the structure of compound 50.

By carrying out the same treatment except for changing the reaction time, the following compounds were prepared: compound 50b (weight average molecular weight: 30,000), compound 50c (weight average molecular weight: 55,000), compound 50d (weight average molecular weigh: 80,000), and compound 50e (weight average molecular weight: 250,000).

<Compound having a Partial Structure Selected from Formulas (3) to (5) of the Present Invention>

The compounds having a partial structure selected from Formulas (3) to (5) of the present invention will be described.

In Formulas (3) to (5), examples of an aliphatic group represented by Ra include: an alkyl group (for example, a methyl group, an ethyl group, a propyl group, a butyl group, a pentyl group, an iso-pentyl group, a 2-ethyl hexyl group, an octyl group, and an undecyl group); and a cycloalkyl group (for example, a cyclopentyl group, and a cyclohexyl group).

These groups may have a substituent represented by Rb and Rc which will be described later.

In Formulas (3) to (5), examples of an aromatic hydrocarbon group represented by Ra include: a phenyl group, a tolyl group, an azulenyl group, an anthranyl group, a phenanthryl group, a pyrenyl group, a eryeenyl group, a naphthacenyl group, an o-terphenyl group, a m-terphenyl group, a p-terphenyl group, an acenaphthenyl group, a coronenyl group, a fluorenyl group and a perilenyl group.

These groups may have a substituent represented by Rb and Re which will be described later.

In Formulas (3) to (5), examples of an aromatic heterocyclic group represented by Ra include: for example, a pyridyl group, a pyrimidinyl group, a furyl group, a pyrrolyl group, an imidazolyl group, a benzoimidazolyl group, a pyrazolyl group, a pyradinyl uroup, a triazolyl group (for example, 1,2,4-triazole-1-yl group and 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring structure in which one of the carbon atoms constituting the carboline ring in the aforesaid carbolinyl group is replaced with a nitrogen atom), a quinoxalinyl group, a pyridazinyl group, a triazinyl group, a quinazolinyl group, and a phthalazinyl group), a quinoxalinyl group, a pyridazinyl group, a triazinyl group, a quinazolinyl group, and a phthalazinyl group.

These groups may have a substituent represented by Rb and Rc which will be described later.

Examples of a substituent which is represented by Rb, Rc, $Rb_1$ or $Rc_1$ in Formulas (3) to (5) include: an alkyl group (for example a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group and an allyl group); alkynyl group (for example, an ethynyl group and a propargyl group);, an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyryl group); an aromatic heterocyclic group (for example, a pyridyl group, a pyrimidinyl group, a furyl group, a pyrrolyl group, an imidazolyl group, a benzoimidazolyl group, a pyrazolyl group, a pyradinlyl group, a triazolyl group (for example, 1,2,4-triazole-1-yl group and 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring structure in which one of the carbon atoms constituting the carboline ring in the aforesaid cabolinyl group is replaced with a nitrogen atom), a quinoxalinyl group, a pyridazinlyl group, a triazinyl group, a quinazolinyl group, and a phthalazinyl group), a quinoxalinyl group, a pyridazinyl group, a triazinyl group, a quinazolinyl group, a phthalizinyl, group); a heterocyclic group (for example, a pyrrolidyl group, an imidazolidyl group, a morpholyl group, and an oxazoldiyl group); an alkoxyl group (for example, a methoxy group, an ethoxy group, a proploxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkythio group (for example, a cyclopentylthio group and a cyclohexylthio group); an arylthio group (for example, a phenylthio group and a naphtylthio group); an alkoxycarbonyl group (for example, a methloxycarbonyl group, an ethyloxycarbonlyl group, a butyloxycarbonyl group, an octyloxycarbonlyl group, and a dodecyloxycarbonlyl group); an aryloxycarbonlyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an actyl group (for example, an actyl group, an ethylcarbonlyl group, a propylcarbonyl group, a pentylcarbonlyl group, a cyclohexylcarbonyl group, an octylcarbonyl group, a 2-ethylhexylcarbonyl group, a dodecylcarbonlyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentyl carbonyl amino group, a cyclohexylcarbonylamino group, a 2-ethylhexylcarbonylamino gro octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl gropup, a phenylarninocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-oyridylaminoureido group); a sulfinyl group (for example, a rnethylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethyl sulfonyl group, a butylsulfinyl group, a cyclohexylsulfonyl group, a 2-ethylltexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom, and a bromine atom); a fluorinated hydrocarbon group (for example, a fluoromethyl group, a trifluoromethyl group, a pentafluoroethyl group, and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldicthylsilyl group).

These rings may further have a substituent represented by the above-described Rb or Rc.

In Formulas (3) to (5), examples of an aromatic hydrocarbon ring fouited by A1 are: a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring, and an anthraanthrene ring.

These rings may further have a substituent represented by the above-described Rb or Rc.

In Formulas (3) to (5), examples of an aromatic heterocyclic ring formed by are: a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a carbazole ring, a carboline ring, and a diazacarbazole ring (here, "a diazacarbazole ring" indicates a ring structure in which at least one of the carbon atoms constituting the carboline ring is replaced with a nitrogen atom).

These rings may further have a substituent represented by the above-described Rb or Rc.

The structure represented by any one of Formulas (3) to (5) is a partial structure, it is required a sufficient number of ligands corresponding to the valence of M which forms the partial structure in order to become a emitting dopant having a complete molecular structure.

Specific examples of a ligands are: a halogen atom (for example, a fluorine atom, a chlorine atom, a bromine atom, and an iodine atom), an aryl group (for example, a phenyl group, a p-chlorophenyl group, a mesityl group, a tolyl group, a xylyl group, a biphenyl group, a naphthyl group, an anthryl group, and a phenanthryl group), an alkyl group (for example, a methyl group, an ethyl group, an isopropyl group, a hydroxyethyl group, a methoxymethyl group, a trifluoromethyl group, and t-butyl group), an alkoxy group, an aryloxy group, an alkylthio group, an arylthio group, an aromatic heterocyclic group (for example, a furyl group, a thienyl group, a pyridyl group, a pyridazinyi group, a pyrimidinyl group, a pyrazinyl group, the triazinyl group, an imidazolyl group, a pyrazolyi group, a thiazolyl group, a quinazolinyl group, a carbazolyl group, a carbolinyl group, and phthalazinyl group, and a partial structure removed M from Formulas (3) to (5).

In Formulas (3) to (5), M represents Ir or Pt. Especially, Ir is preferable. Moreover, a preferable compound is a tris compound which is completed with three partial structures of Formulas (3) to (5).

In the following, there are listed compounds preferably used as a light emitting dopant, especially, as a phosphorescence dopant, and containing a partial structure of Formulas (3) to (5). However, the present invention is not limited to these.

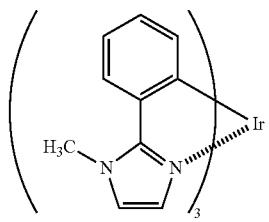

D-1

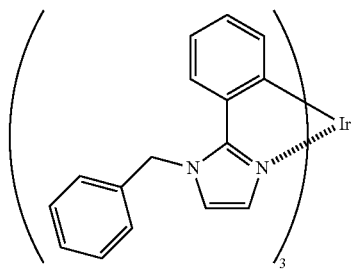

D-2

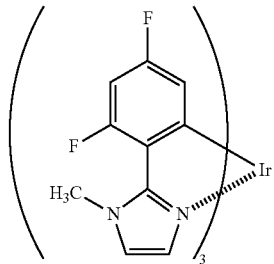

D-3

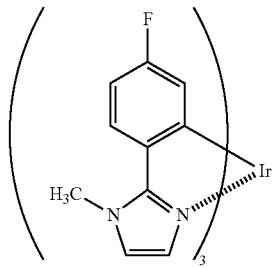

D-4

-continued
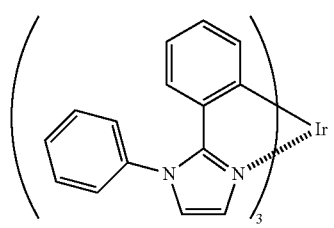
D-5
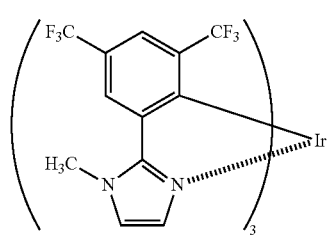
D-6
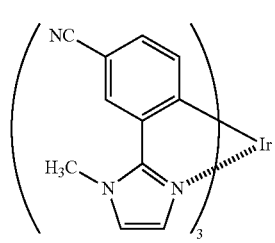
D-7
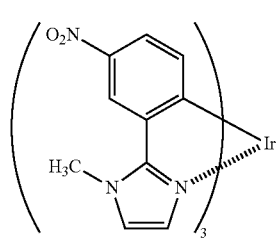
D-8
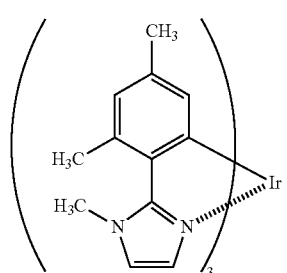
D-9
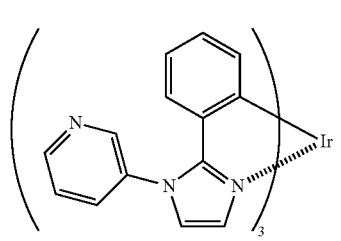
D-10
-continued
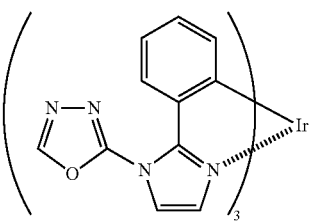
D-11
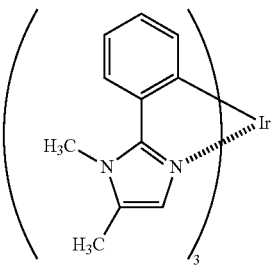
D-12
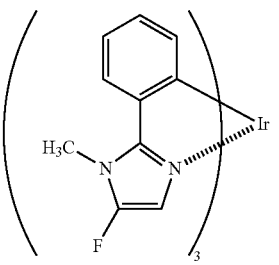
D-13
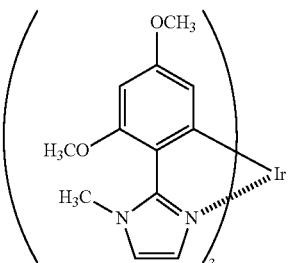
D-14
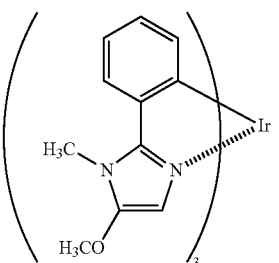
D-15
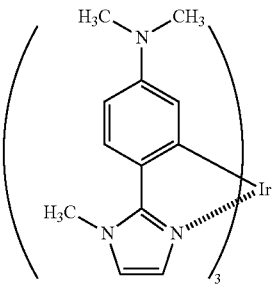
D-16

-continued
D-17
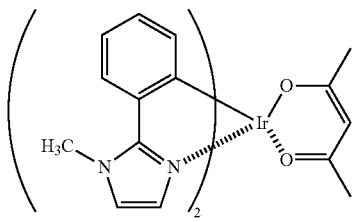
D-18
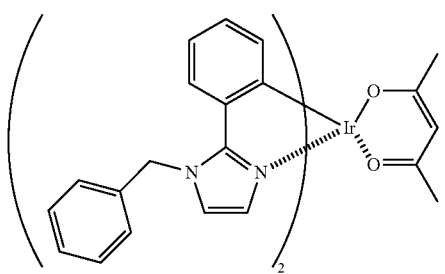
D-19
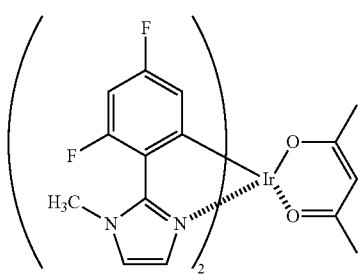
D-20
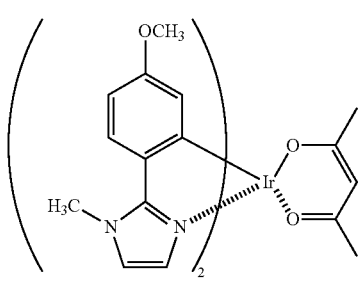
D-21
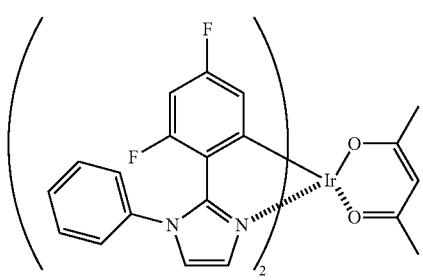
D-22
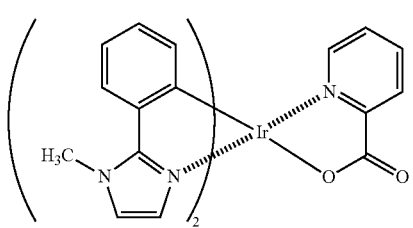
-continued
D-23
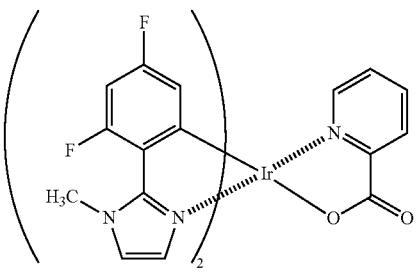
D-24
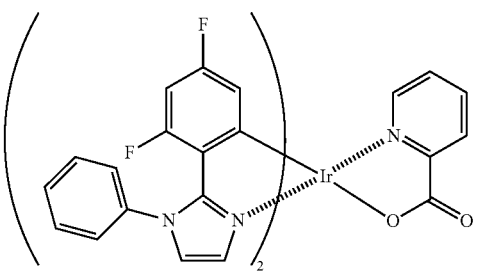
D-25
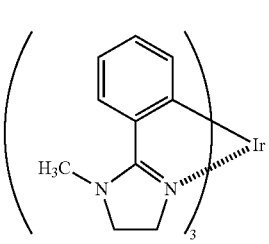
D-26
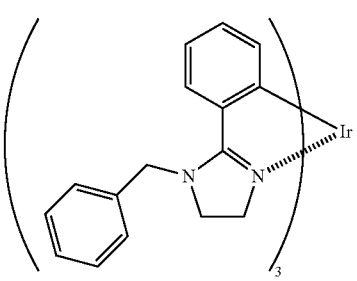
D-27
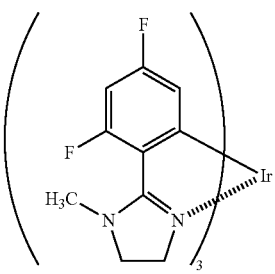
D-28

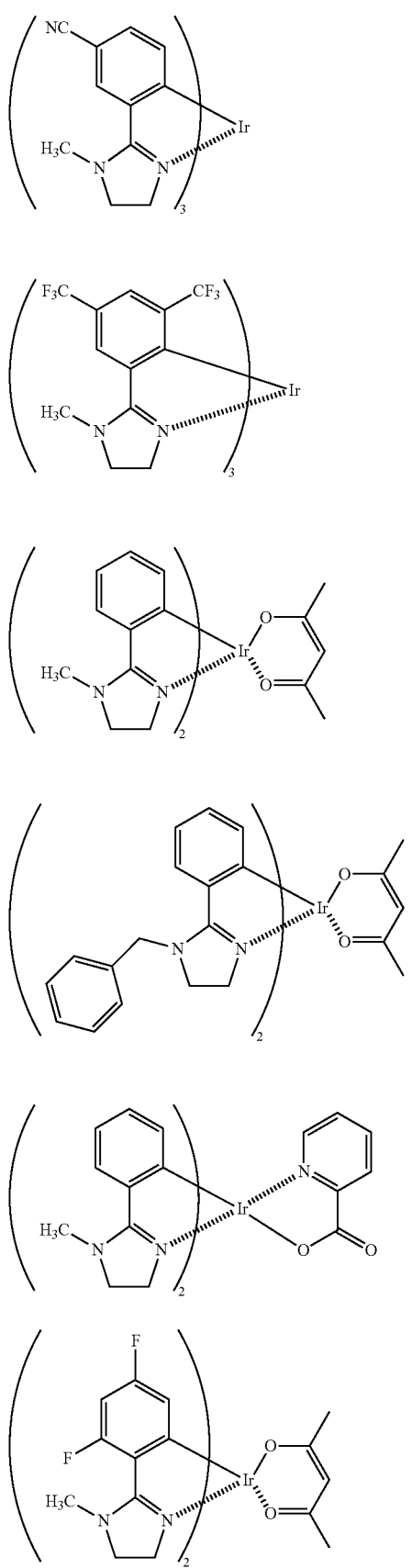
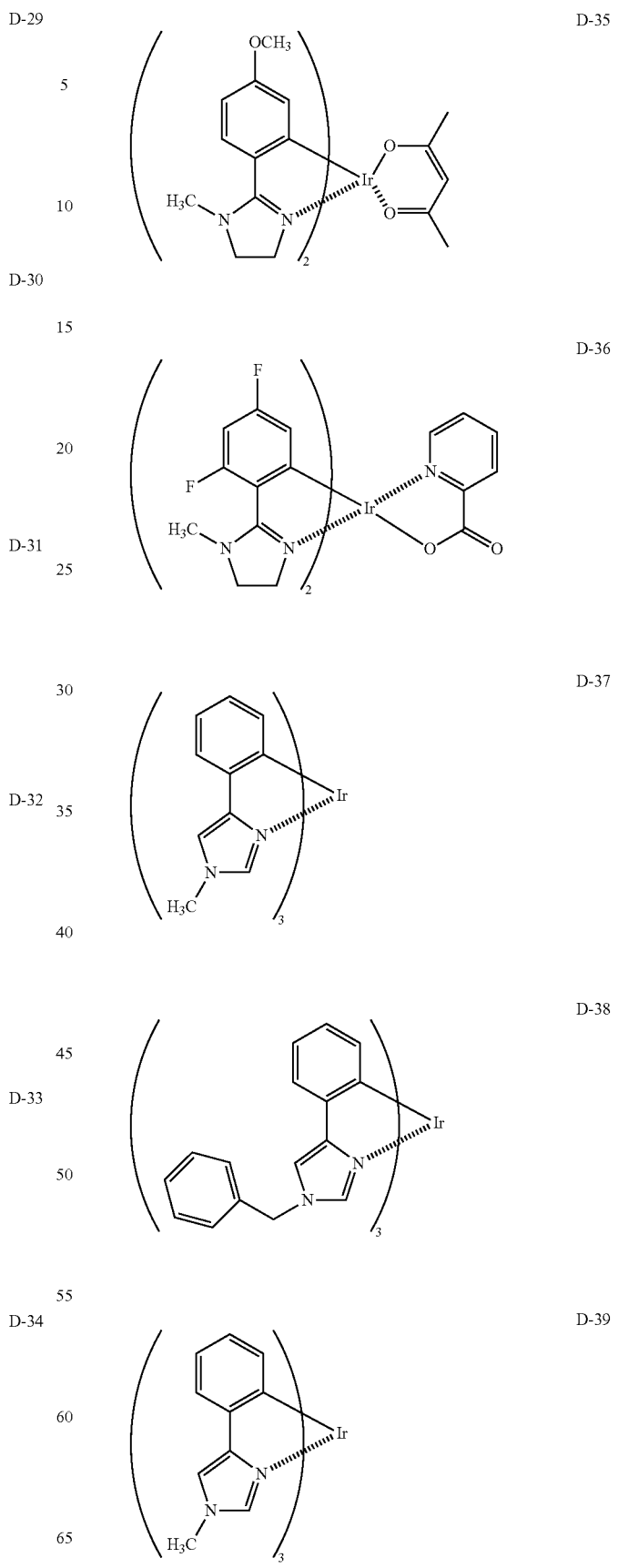

D-40 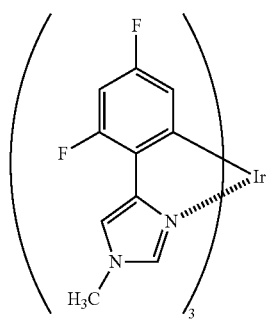
D-41 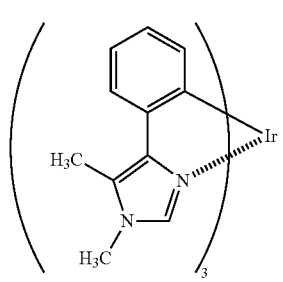
D-42 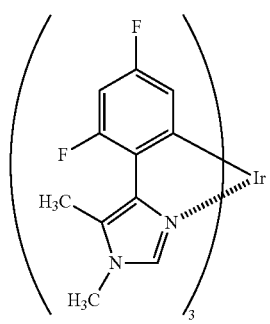
D-43 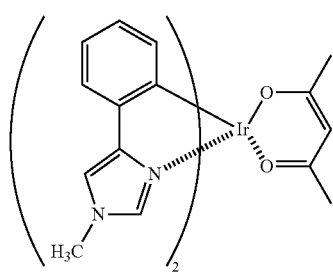
D-44 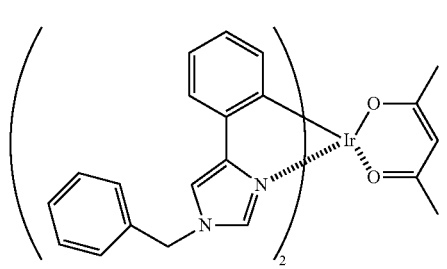
D-45 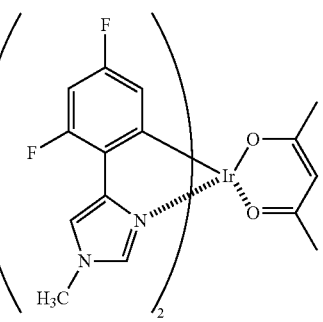
D-46 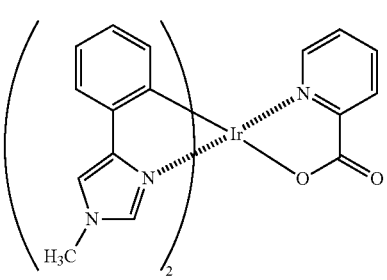
D-47 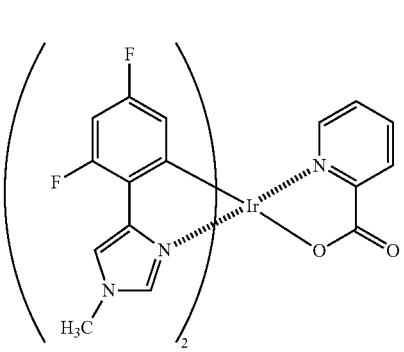
D-48 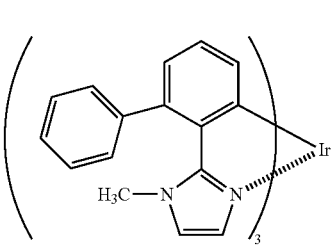
D-49 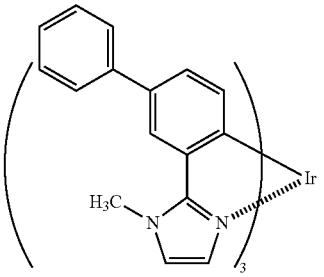

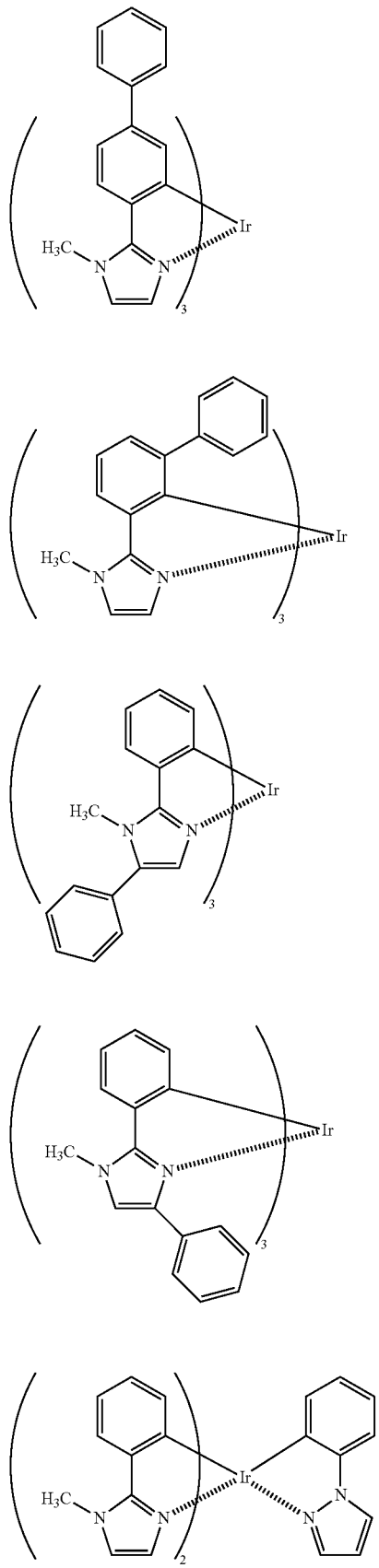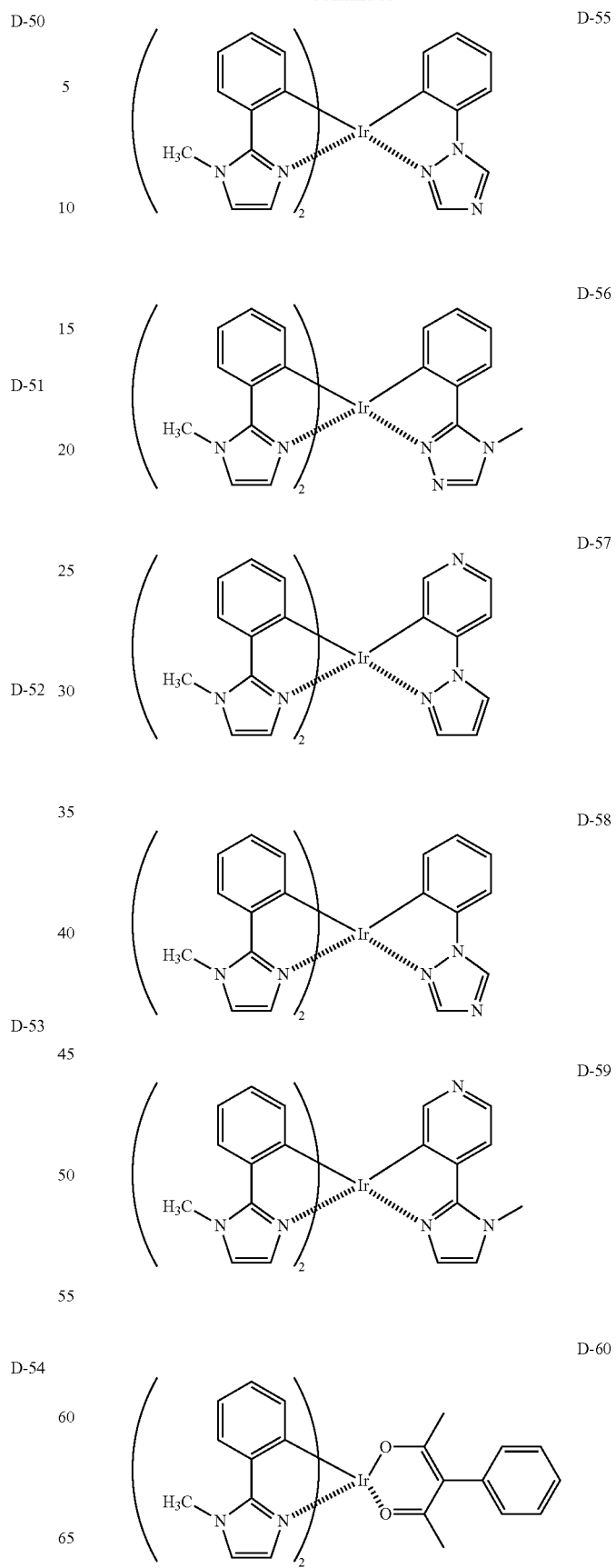

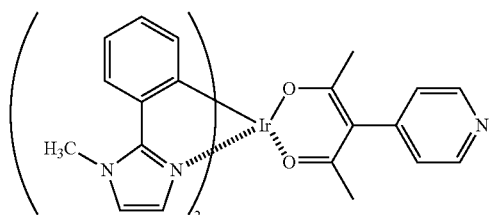
D-61
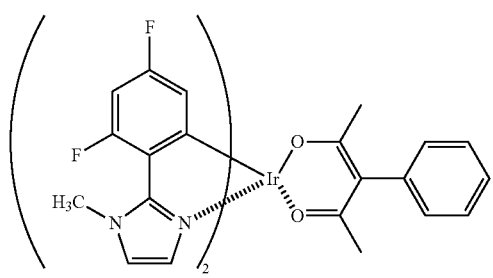
D-62
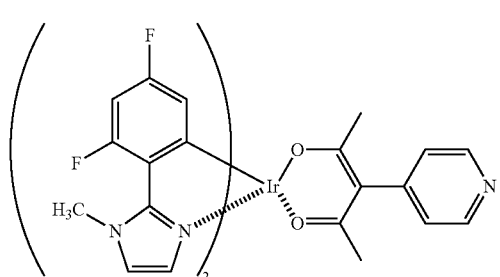
D-63
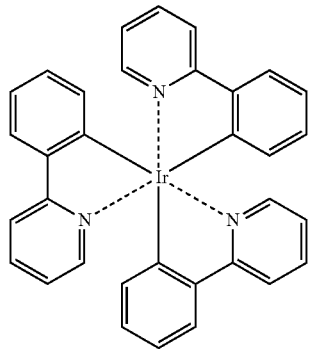
D-64
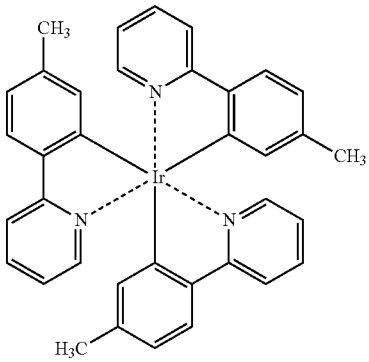
D-65
A phosphorescence dopant containing any one of the partial structure of Formulas (3) to (5) can be synthesized according to the method described in Inorg. Chem., vol. 40, 1714-1711, for example.
Moreover, as a phosphorescence dopant, the conventionally well-known compound shown below can be used together.
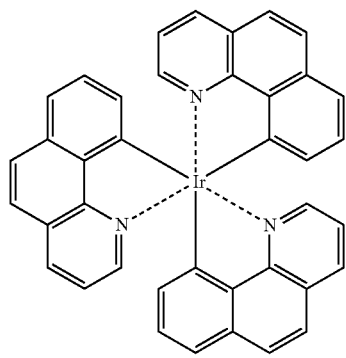
Ir-1
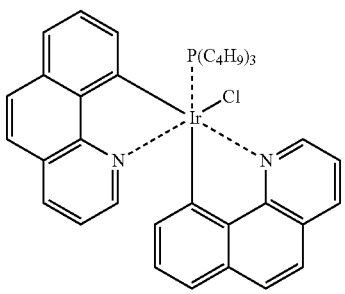
Ir-2
Ir-3
Ir-4

-continued
Ir-5
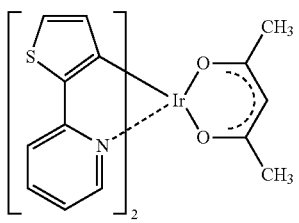
Ir-6
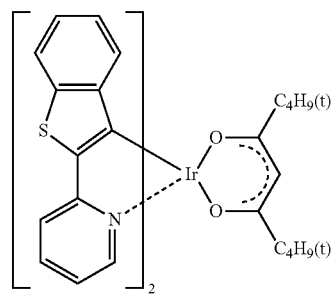
Ir-7
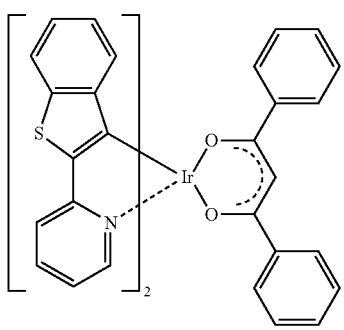
Ir-8
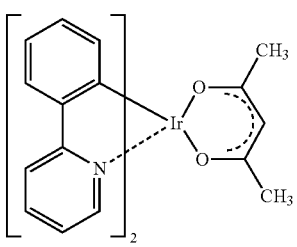
Ir-9
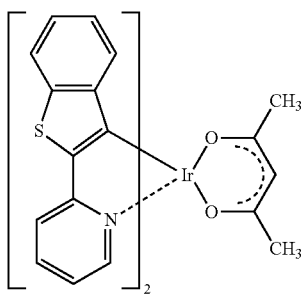
Ir-10
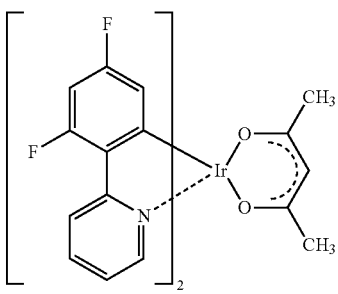
Ir-11
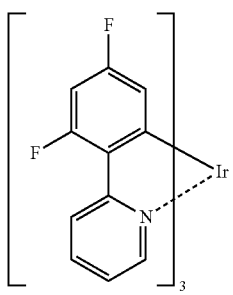
Ir-12
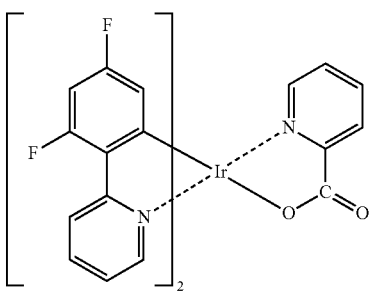
Ir-13
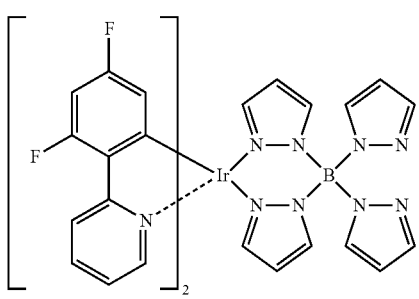
Ir-14
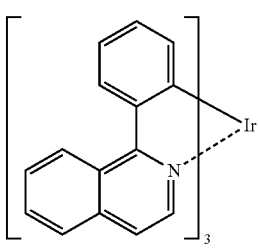

-continued
Ir-15
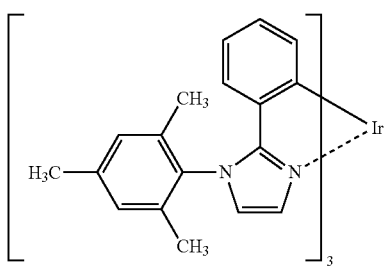
Ir-16
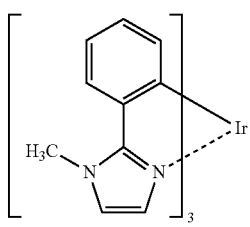
Pt-1
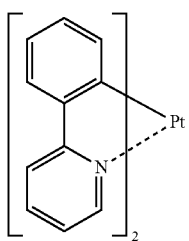
Pt-2
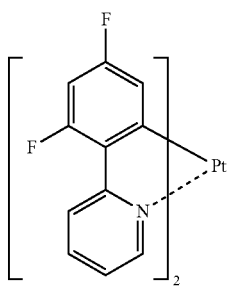
Pt-3
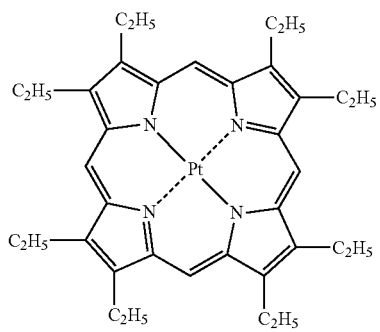
A-1
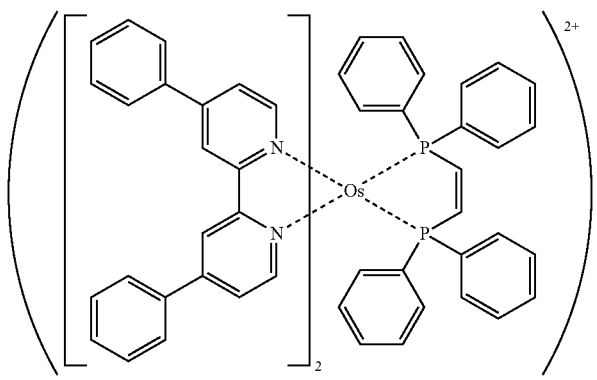
Ir-17
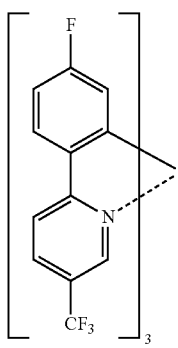
Ir-18
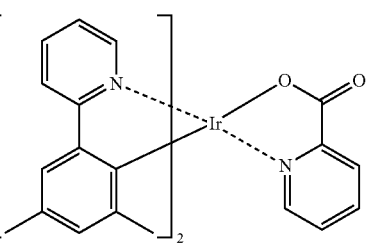

Ir-19

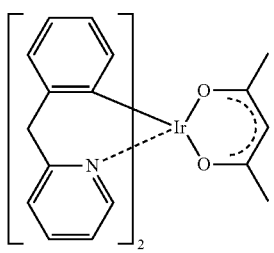

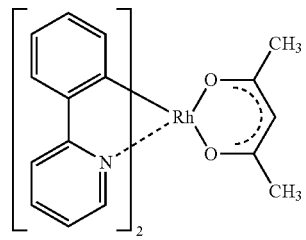
Rh-4

Rh-5
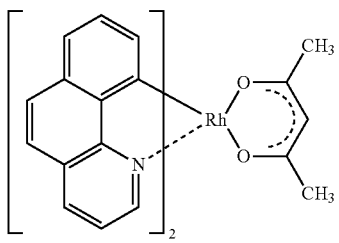

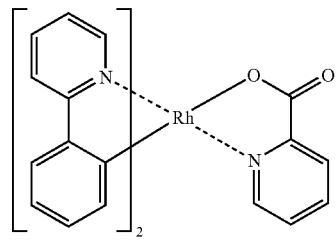
Rh-6

Pd-1
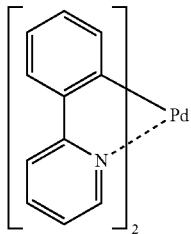

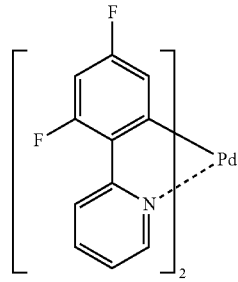
Pd-2

Pd-3
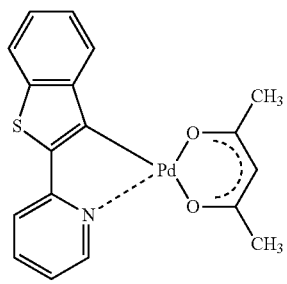

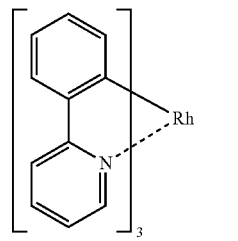
Rh-1

Rh-2
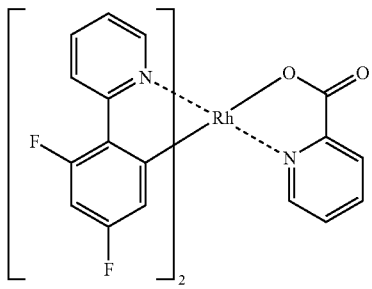

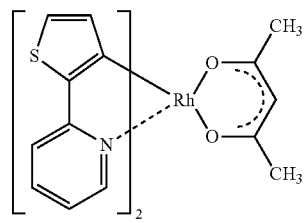
Rh-3

<Constituting layers of Organic EL Element>

Each of the layers which constitute the organic EL element of the present invention will now be detailed. Preferred embodiments of the organic EL element of the present invention will be described below, however, the present invention is not limited to these.

(i) anode/hole injection layer/hole transport layer/light emitting layer/electron transport layer/electron injection layer/cathode (ii) anode/hole injection layer/hole transport layer/light emitting layer/hole blocking layer/electron transport layer/cathode buffer layer/cathode With respect to the organic EL element of the present invention, the maximum emission wavelength of the blue light emitting layer is preferably from 430 nm to 480 nm. the maximum emission wavelength of the green light emitting layer is preferably from 510 nm to 550 nm and the maximum emission wavelength of the red light emitting layer is preferably from 600 nm to 640 nm. At least three kinds light emitting layers may be laminated to form a white light emitting layer. Further, there may be present a non-light emitting intermediate layer between the light emitting layers. The organic EL element of the present invention have preferably a white light emitting layer, and lighting devices employing these are preferred.

Each of the layers which constitute the organic EL elements of the present invention will now be detailed.

<Light Emitting Layer>

The light emitting layer of the present invention is a layer, which emits light via recombination of electrons and holes injected from an electrode or a layer such as an electron transport layer or a hole transport layer. The light emission portion may be present either within the light emitting layer or at the interface between the light emitting layer and an adjacent layer thereof.

The total thickness of the light emitting layer is not particularly limited. However, in view of the layer homogeneity, the minimization of application of unnecessary high voltage during light emission, and the stability enhancement of the emitted light color against the drive electric current; the layer thickness is regulated preferably in the range of 2 nm to 5 μm, more preferably in the range of 2 nm to 200 nm, but most preferably in the range of 10 nm to 20 nm.

The light emitting layer of the organic EL element of the present invention incorporates a light emitting dopant (a phosphorescent dopant or a fluorescent dopant) and a light emitting host compound. The molecular weight of the light emitting materials contained in the light emitting layer is preferably 3,000 or less.

(Light Emitting Dopant Compound)

The light emitting dopant compound will now be described.

As light emitting dopants according to the present invention, it can be employed fluorescent dopants (also referred to as fluorescent compounds) and phosphorescent dopants (also referred to as phosphorescent emitting materials, phosphorescent compounds or phosphorescence emitting compounds). From the viewpoint of obtaining an organic EL element exhibiting high light emitting efficiency, a compound represented by the foregoing Formulas (3) to (5) is contained in the light emitting layer of the organic EL element of the present invention as a light emitting dopant which acts as a phosphorescence emitting dopant.

(Phosphorescent Dopant)

A phosphorescence dopant of the present invention will be described.

The phosphorescent dopant of the present invention is a compound, wherein emission from an excited triplet state thereof is observed, specifically, emitting phosphorescence at room temperature (25° C.) and exhibiting a phosphorescence quantum yield of 0.01 or more at 25° C. The phosphorescence quantum yield is preferably 0.1 or more.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However it is only necessary for the phosphorescent dopant of the present invention to exhibit the above phosphorescence quantum yield (0.01 or more) using any of the appropriate solvents.

Two kinds of principles regarding emission of a phosphorescent dopant are cited. One is an energy transfer-type, wherein carriers recombine on a host compound on which the carriers are transferred to produce an excited state of the host compound, and then via transfer of this energy to a phosphorescent dopant, emission from the phosphorescence-emitting dopant is realized. The other is a carrier trap-type, wherein a phosphorescence-emitting dopant serves as a carrier trap and then carriers recombine on the phosphorescent dopant to generate emission from the phosphorescent dopant. In each case, the excited state energy of the phosphorescent dopant is required to be lower than that of the host compound.

In the present invention, the phosphorescence dopant can be suitably chosen from the compounds represented by the above-mentioned Formulas (3) to (5), and it can be used.

(Light Emitting Host Compounds (also Referred to as Light Emitting Hosts)

"Host compounds", as described in the present invention, are defined as compounds, incorporated in a light emitting layer, which result in a mass ratio of 20% or more in the above layer and also result in a phosphorescent quantum yield of the phosphorescence emission of less than 0.1. A preferable quantum yield of the phosphorescence emission is less than 0.01.

Further, among the compounds incorporated in the light emitting layer, it is preferable that the mass ratio of the host compound in the aforesaid layer is 20% or more.

Strictures of the light emitting host employed in the present invention are not particularly limited. The conventionally known host compounds in organic EL elements can be used. Representative compounds include those having a basic skeleton such as carbazole derivatives, triarylamine derivatives, aromatic compound derivatives. nitrogen-containing heterocyclic compounds, thiophene derivatives, furan derivatives, oligoarylene compounds, carboline derivatives, or multi-azacarbazole derivatives (here, "a multi-azacarbazole derivative" indicates a ring structure in which at least one of the carbon atoms constituting the carboline ring is replaced with a nitrogen atom).

A known light emitting host (or emission host) which may be used in the present invention is preferably a compound having a hole transporting ability and an electron transporting ability, as well as preventing elongation of an emission wavelength and having a high Tg (a glass transition temperature).

It may be used an emission host compound of the present invention singly or it may be used in combination with plural host compounds, which maybe other host compound of the present invention or a known host compound.

It is possible to control the transfer of charges by making use of a plurality of host compounds, which results in high efficiency of an organic EL element.

In addition, it is possible to mix a different emission lights by making use of a plurality of known phosphorescent dopants as described above. Any required emission color can be obtained thereby.

Further, an emission host used in the present invention may be either a low molecular weight compound or a polymer compound having a repeating unit, in addition to a low molecular weight compound provided with a polymerizing group such as a vinyl group and an epoxy group (an evaporation polymerizing emission host). These compounds may be used singly or in combination of two or more compounds.

As specific known examples of an emission host compounds, the compounds described in the following documents are preferable.

For example, JP-A Nos. 2001-257076, 2002-308855, 2001-3 13179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-

234888, 2003-27048, 2002-255934, 2002-260861, 2002-280183, 2002-299060, 2002-302516, 2002-305083, 2002-305084 and 2002-308837.

Next, an injection layer, a blocking layer and an electron transport layer, which are used as a constituting layer of an organic EL element concerning to the present invention, will be described.

<Injection Layer: Electron Injection Layer, Hole Injection Layer>

An injection layer is appropriately provided and includes an electron injection layer and a hole injection layer, which may be arranged between an anode and an emitting layer or a hole transfer layer, and between a cathode and an emitting layer or an electron transport layer, as described above.

An injection layer is a layer which is arranged between an electrode and an organic layer to decrease an operating voltage and to improve an emission luminance, which is detailed in volume 2, chapter 2 (pp. 123- 166) of "Organic EL Elements and Industrialization Front thereof (Nov. 30, 1998, published by N. T. S Corp.)", and includes a hole injection layer (an anode buffer layer) and an electron injection layer (a cathode buffer layer).

An anode buffer layer (a hole injection layer) is also detailed in such as JP-A Nos. 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polyaniline (or called as emeraldine) or polythiophene.

A cathode buffer layer (an electron injection layer) is also detailed in such as JP-A Nos, 6-325871, 9-17574 and 10-74586, and specific examples include a metal buffer layer represented by strontium and aluminum, an alkali metal compound buffer layer represented by lithium fluoride, an alkali earth metal compound buffer layer represented by magnesium fluoride, and an oxide buffer layer represented by aluminum oxide. The above-described buffer layer (injection layer) is preferably a very thin layer, and the layer thickness is preferably in the range of 0.1 nm to 5 µm, and more preferably in the range of 20 nm to 100 nm although it depends on a raw material.

<Blocking Layer: Hole Blocking Layer, Electron Blocking Layer>

A blocking layer is appropriately provided in addition to the basic constitution layers composed of Organic thin layers as described above. Examples are described in such as JP-A Nos. 11-204258 and 11-204359 and p. 273 of "Organic EL Elements and Industrialization Front Thereof (Nov. 30 (1998), published by N. T. S Corp.)" is applicable to a hole blocking (hole block) layer according to the present invention.

A hole blocking layer, in a broad meaning, is provided with a function of electron transport layer, being comprised of a material having a function of transporting an electron but a very small ability of transporting a hole, and can improve the recombination probability of an electron and a hole by blocking a hole while transporting an electron Further, a constitution of an electron transport layer described above can be appropriately utilized as a hole blocking layer according to the present invention.

The blocking layer of the organic EL element of the present invention is preferably arranged adjacent to the light emitting layer.

It is preferable that the hole blocking layer incorporates a carbazole derivative, or a carboline derivative, or a diazacarbazole derivative listed as a host compound as described above.

Further, in the present intention, in the case in which a plurality of light emitting layers which differ in a plurality of different emitted light colors, it is preferable that the light emitting layer which results in the shortest wavelength of the emitted light maximum wavelength is nearest to the anode in all light emitting layers. However, in such a case, it is preferable to additionally arrange the hole blocking layer between the aforesaid shortest wavelength layer and the light emitting layer secondly near the anode. Further, 50% or more by mass of the compounds incorporated in the hole blocking layer arranged in the aforesaid position preferably exhibits the ionization potential which is greater by 0.3 eV or more than that of the host compounds of the aforesaid shortest wavelength light emitting layer.

In the present invention, it is preferable that the light emitting layer contains plural light emitting materials each having a different emitting light color, and it is preferable that the plural light emitting materials have at least two maximum emissions in the range of 420 to 650 nm and one minimum emission in the range of 480 to 510 nm in the light emission spectrum.

On the other hand, the electron blocking layer, as described herein, has a function of the hole transport layer in a broad sense, and is composed of materials having markedly small capability of electron transport, while having capability of transporting holes and enables to enhance the recombination probability of electrons and holes by blocking electrons, while transporting electrons. Further, it is possible to employ the constitution of the hole transport layer, described below, as an electron blocking layer when needed. The thickness of the hole blocking layer and the electron transport layer according to the present invention is preferably in the range of 3 nm to 100 nm, but more preferably it is in the range of 5 nm to 30 nm.

<Hole Transport Layer>

A hole transport layer contains a material having a function of transporting a hole, and in a broad meaning, a hole injection layer and an electron blocking layer are also included in a hole transport layer. A single layer of or plural layers of a hole transport layer may be provided.

A hole transport material is those having any one of a property to inject or transport a hole or a barrier property to an electron, and may be either an organic substance or an inorganic substance. In the present invention, a polymer containing a partial structure represented by the foregoing Formula (1) is used, and the following known compounds may be used therewith.

For example, listed are a triazole derivative, an oxadiazole derivative, an imidazole derivative, a polyarylalkane derivative, a pyrazolone derivative, a phenylenediamine derivative, an aryl amine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a hole transport material, those described above can be utilized, however, it is preferable to utilized a porphyrin compound, an aromatic tertiary amine compound and a styrylamine compound, and specifically preferably an aromatic tertiary amine compound.

This hole transport layer can be prepared by forming a thin layer made of the above-described hole transport material according to a method well known in the art such as a vacuum evaporation method a spin coating method, a cast method, an inkjet method and a LB method. The layer thickness of a hole transport layer is not specifically limited, however, it is generally 5 nm to 5 urn, and preferably it is 5 nm to 200 nm, more preferably it is 10 nm to 50 nm. This hole transport layer may have a single layer structure comprised of one or not less than two types of the above described materials. When the thickness of the hole injection layer is T1 and the thickness of the hole transport layer is T2, the sum of T1 and T2 is preferably from 30 nm to 150 nm, and more preferably it is from 50 nm to 80 nm. In addition, when the sum of T1 and T2 is constant, and when the relationship of T1 to T2 is T1>T2, the hole injection form the electrode to the light emitting layer is carried out easily, and the driving voltage will be decreased, as a result, the external extraction quantum efficiency and light emission lifetime will be increased. This is preferable.

Further, it is possible to employ a hole transport layer of a higher p property which is doped with impurities. As its example, listed are those described in each of JP-A Nos. 4-297076, 2000-196140, 2001-102175, as well as in J. Appl. Phys., 95, 5773 (2004).

<Electron Transport Layer>

An electron transport layer is composed of a material having a function to transfer an electron, and an electron injection layer and a hole blocking layer are included in an electron transport layer in a broad meaning. A single layer or plural layers of an electron transport layer may be provided.

Until now, electron transport materials (they serve for hole blocking materials) employed in a single electron transport layer, or in an adjacent layer to the cathode side when a plurality of electron transport layers are incorporated, they are only required to have a function of transporting electrons ejected from the cathode to the light emitting layer. As such materials, any of the conventional compounds may be selected and employed. Examples of them include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative. Further, as examples of an oxadiazole derivative described above, the following compounds can be used as an electron transport material: a thiazole derivative in which an oxygen atom in the oxadiazole ring is replaced with a sulfur atom: a quinoxaline derivative which contains a quinoxaline ring known as an electron withdrawing group. Polymer materials, in which these materials are introduced in a polymer chain or these materials form the main chain of polymer, can be also utilized.

Further, a metal complex of a 8-quinolinol derivative such as tris(8-quinoiinol)aluminum (Alq3), tris(5,7-dichloro-8-quinolinol)aluminum, tris(5,7-dibromo-8-quinolinohalurninum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transport material. Further, metal-free or metal phthalocyanine, or a phthalocyanine derivative whose terminal is substituted by an alkyl group and a sulfonic acid group, can be preferably utilized as an electron transport material. In addition, a distyrylpyradine derivative which was cited as a light emitting material can be used as an electron transport material. Moreover, similarly to the case of a hole injection layer and to the case of a hole transfer layer, an inorganic semiconductor such as an n-type-Si and an n-type-SiC can be also utilized as an electron transport material.

The electron transport layer can be prepared by forming a thin layer made of the above-described electron transport material with a known method such as: a vacuum evaporation method, a spin coating method, a cast method, a printing method including an ink-jet method, or a LB method. The layer thickness of the electron transport layer of the present invention is preferably adjusted in the range of 5 nm to 5 μm, and preferably in the range of 5 nm to 200 nm. This electron transport layer may be a single layer structure containing of one or more types of the above described materials.

Further, it is possible to employ an electron transport layer doped with impurities, which exhibits high n property. Examples thereof include those, described in JP-A Nos. 4-297076, 10-270172, 2000-196140, 2001-102175, as well as J. Appl. Phys., 95, 5773 (2004).

In the present invention, it is preferable to use an electron transport layer exhibiting a high n-property to prepare an EL element of small electric power consumption. Further, in order to improve the rectification ratio, it is preferable to use fluoro alcohol.

Next, there will be listed specific example compounds used for hole transport materials, light emitting hosts, and electron transport materials of the organic EL element of the present invention. However, the present invention is not limited to them.

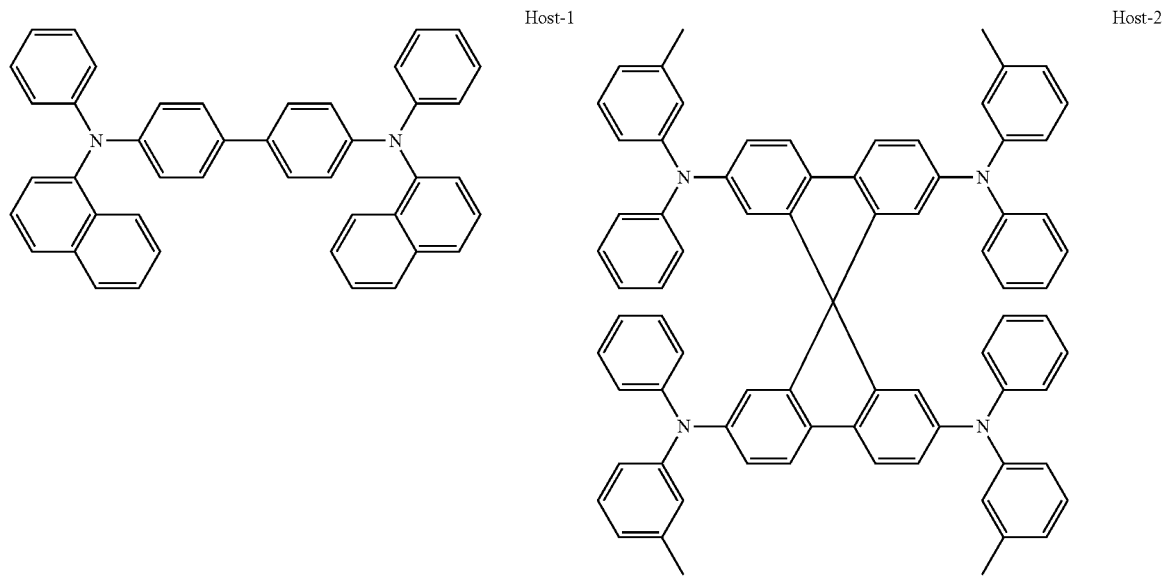

Host-1

Host-2

-continued
Host-3
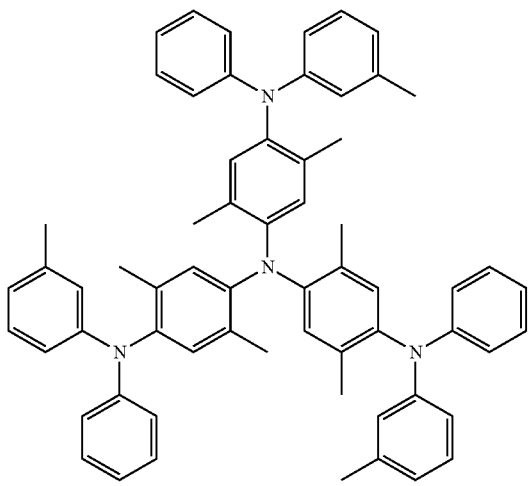
Host-4
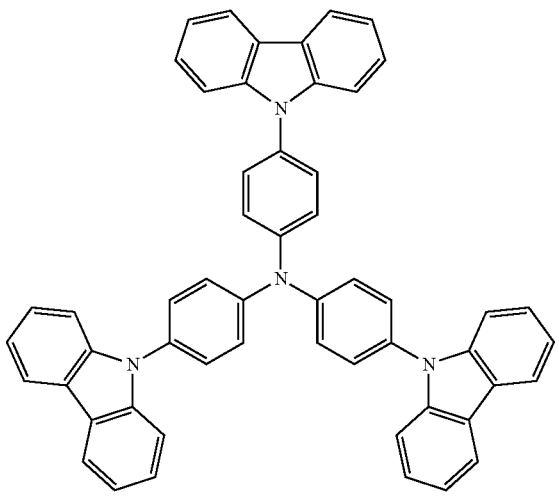
Host-5
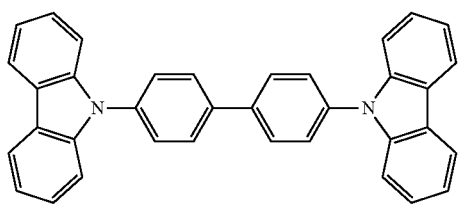
Host-6
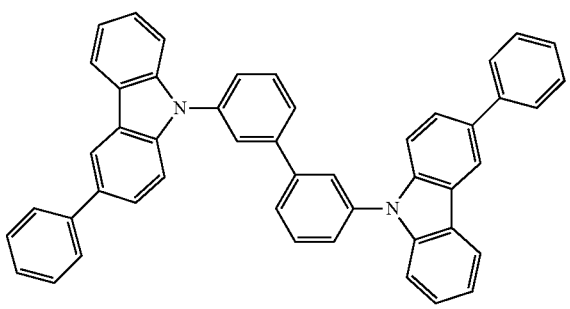
Host-7
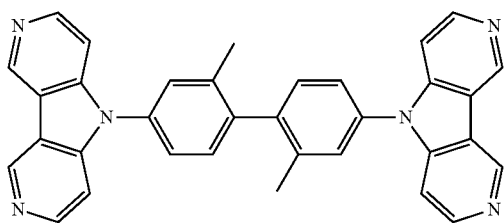
Host-8
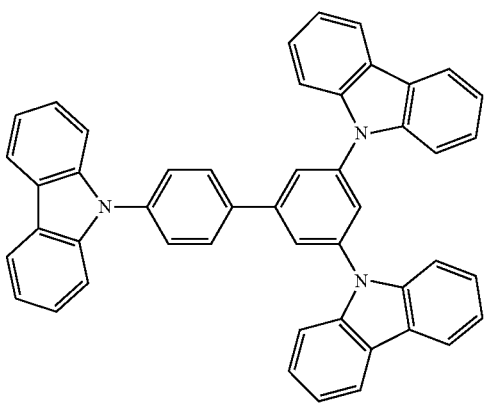
Host-9
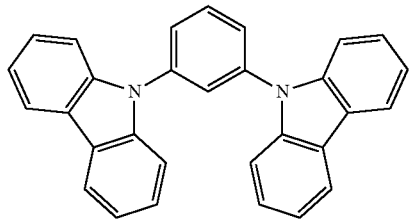
Host-10
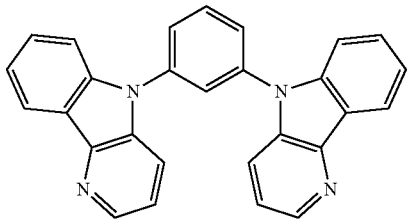

-continued
Host-11
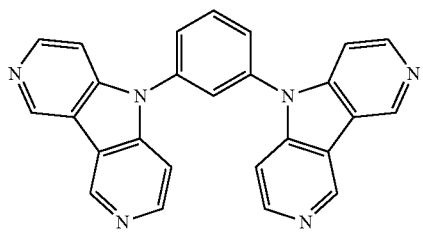
Host-12
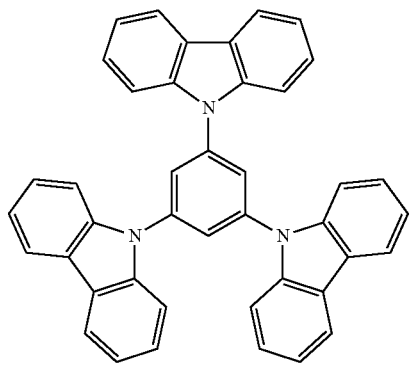
Host-13
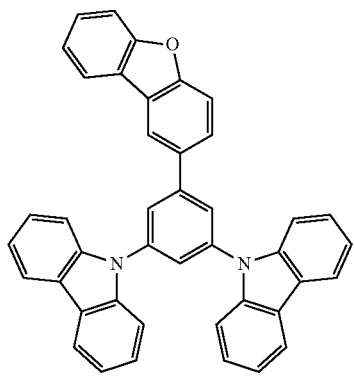
Host-14
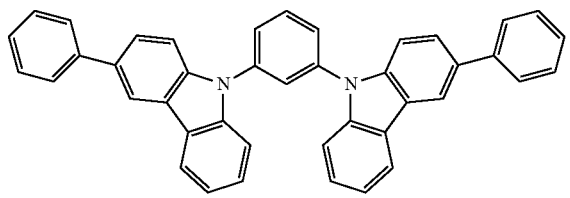
Host-15
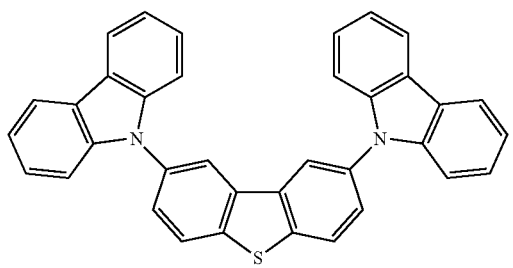
Host-16
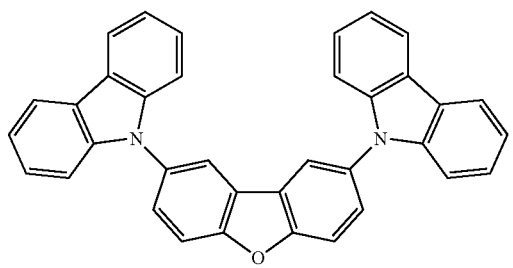
Host-17
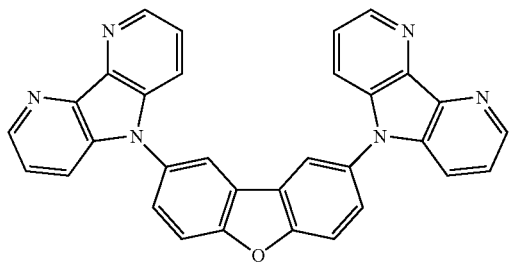
Host-18
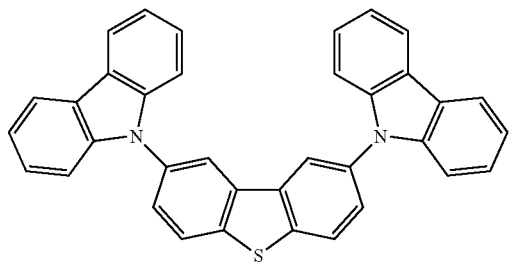

Host-19
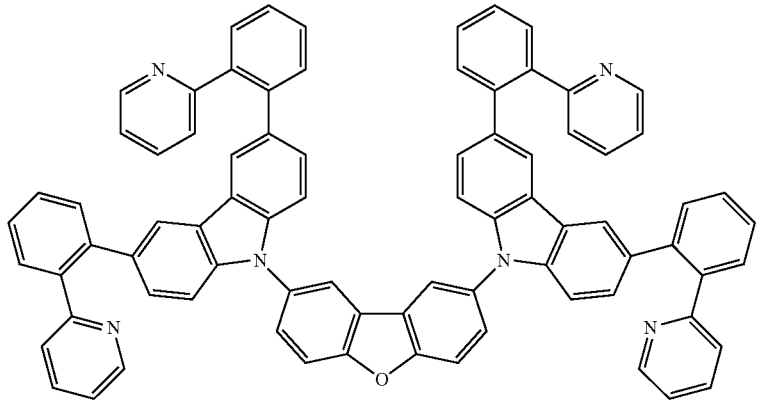
Host-20
Host-21
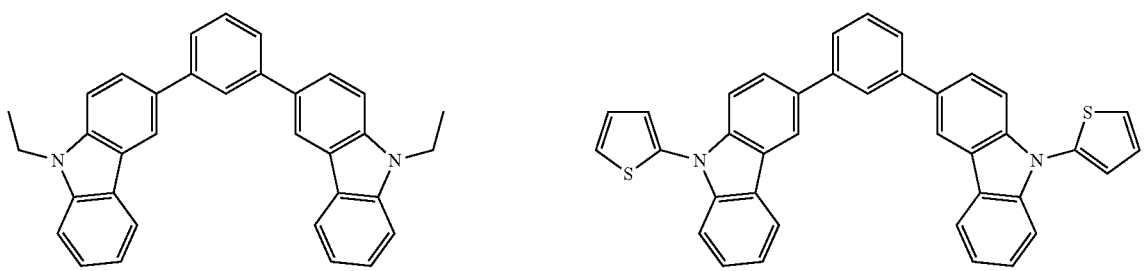
Host-22
Host-23
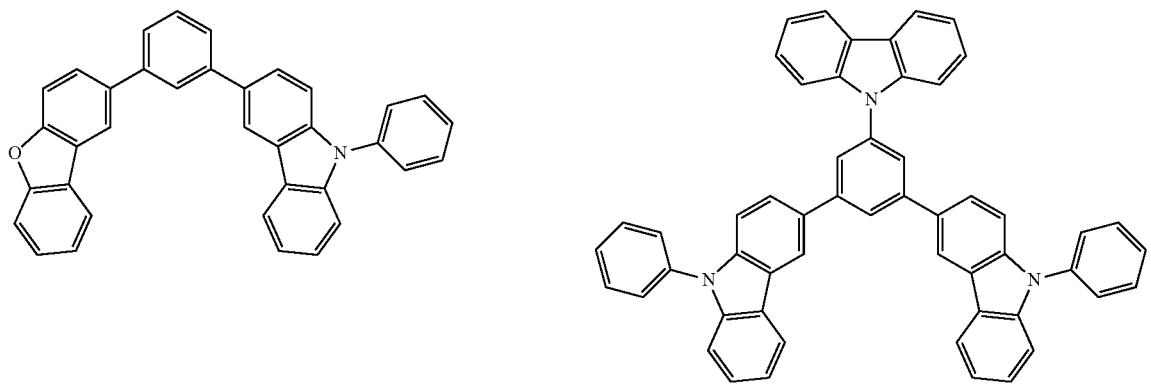
Host-24
Host-25
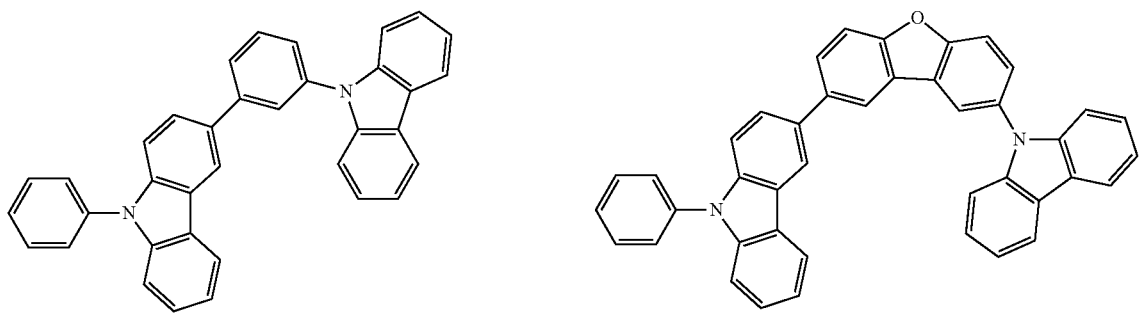

-continued
Host-26
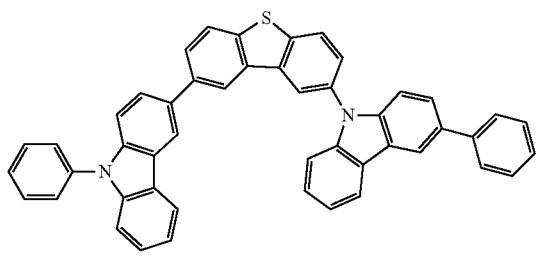
Host-27
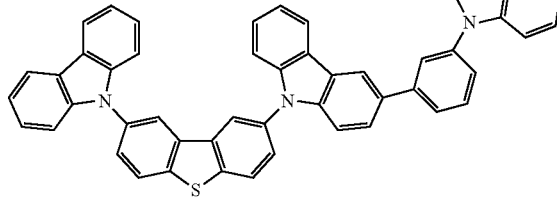
Host-28
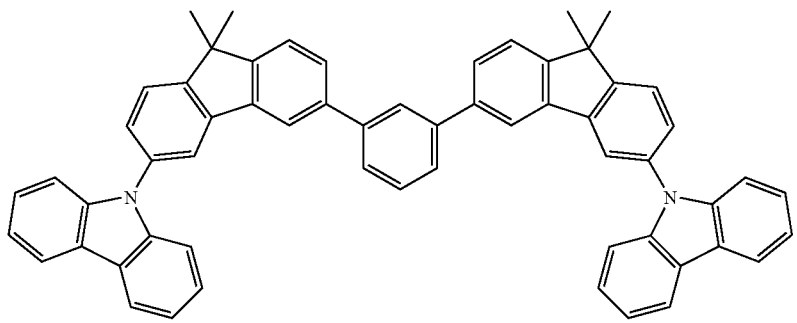
Host-29
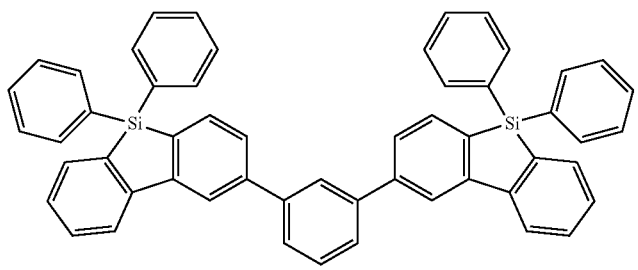
Host-30
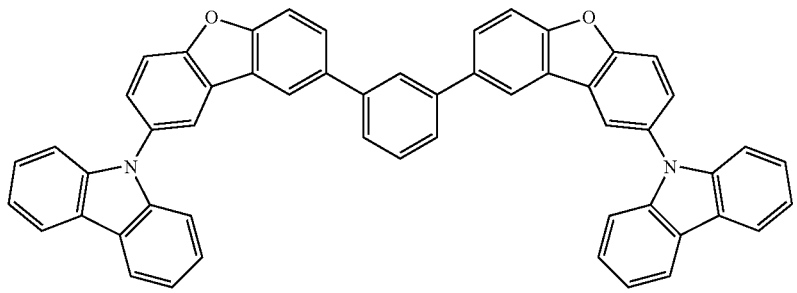
Host-31
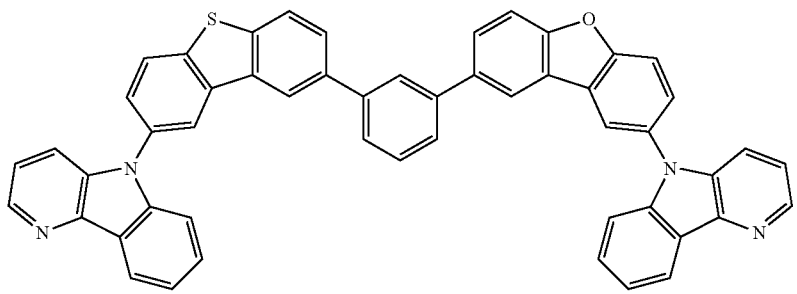

-continued
Host-32
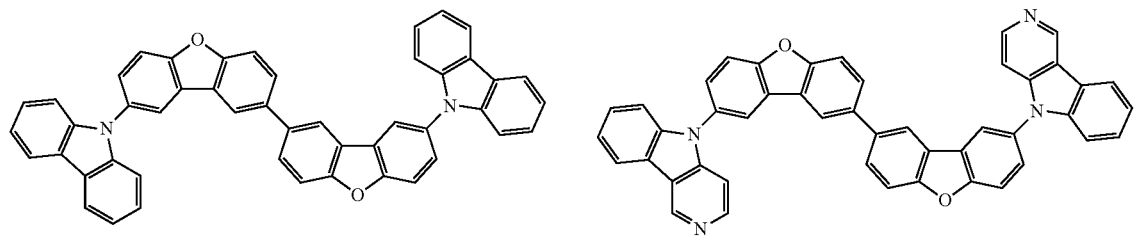
Host-33
Host-34
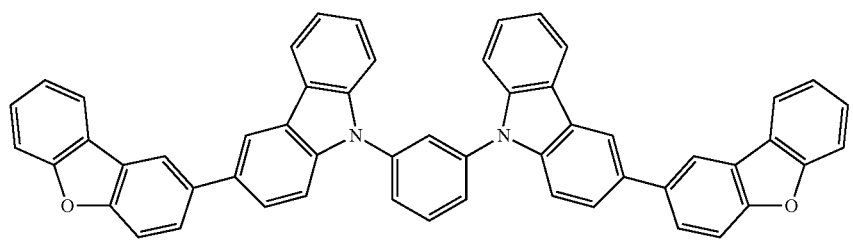
Host-35
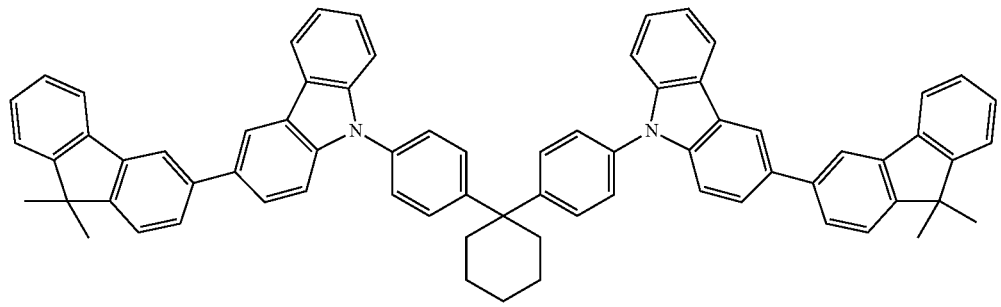
Host-36
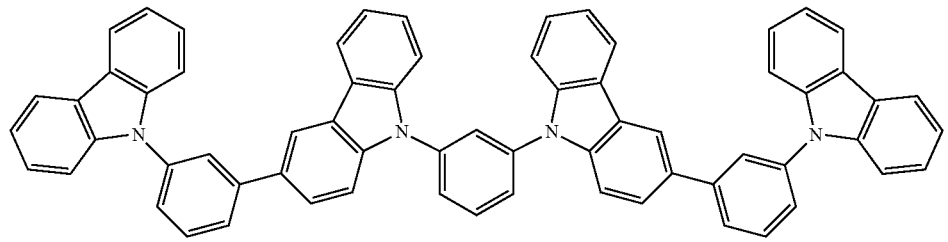
Host-37
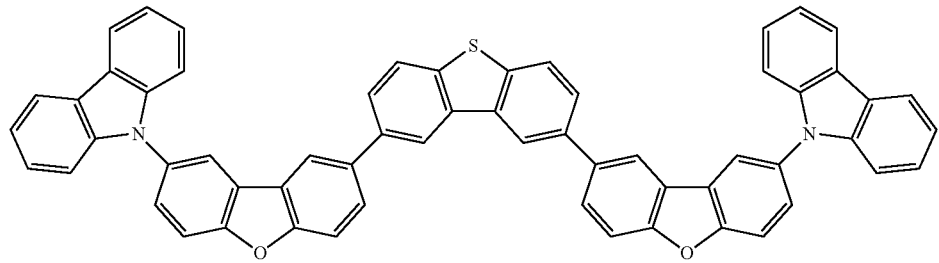

Host-38
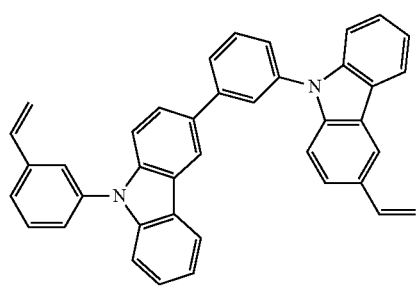
Host-39
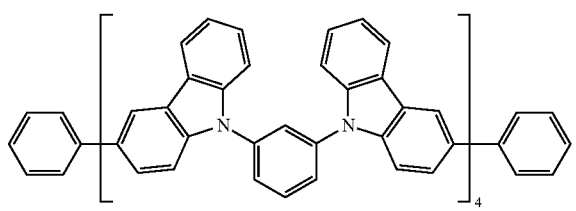
Host-40
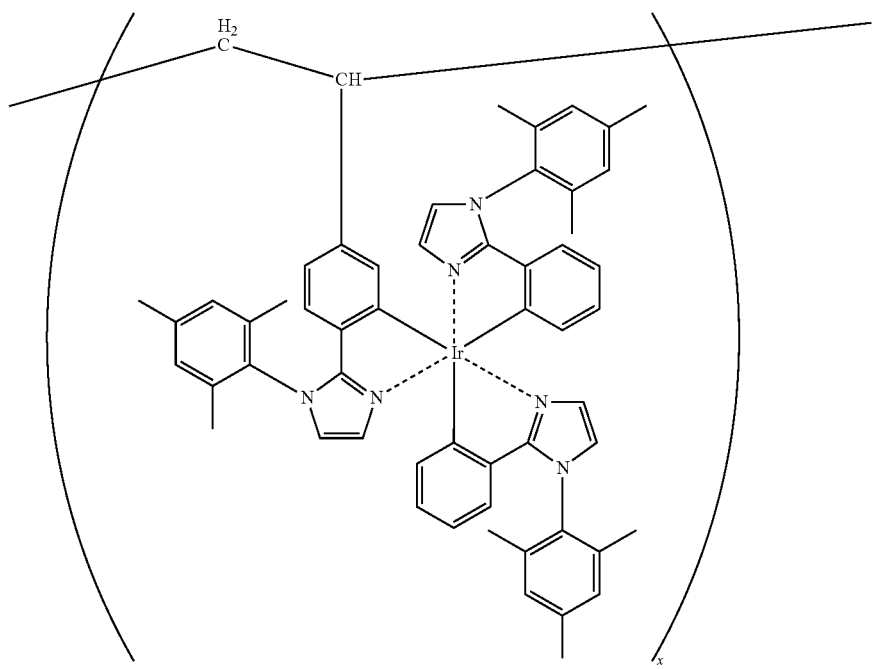
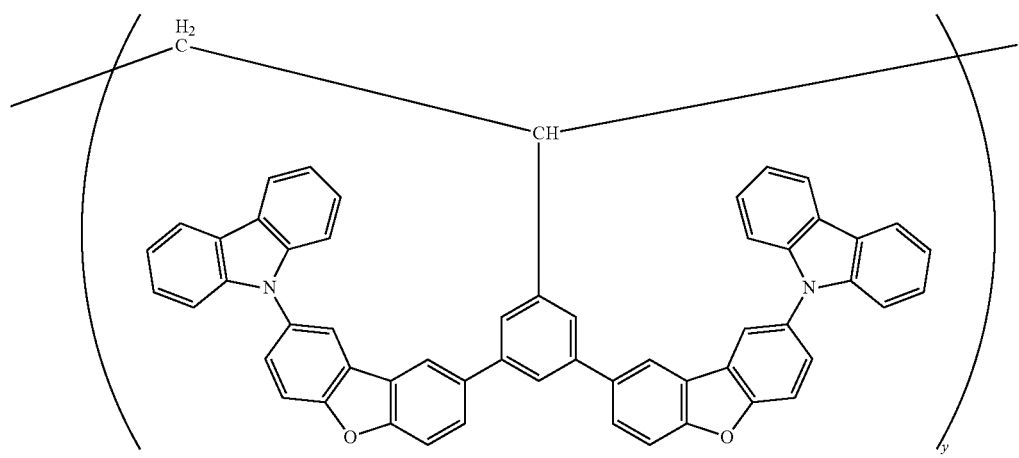
x:y = 1:10
random co-polymer Host-41
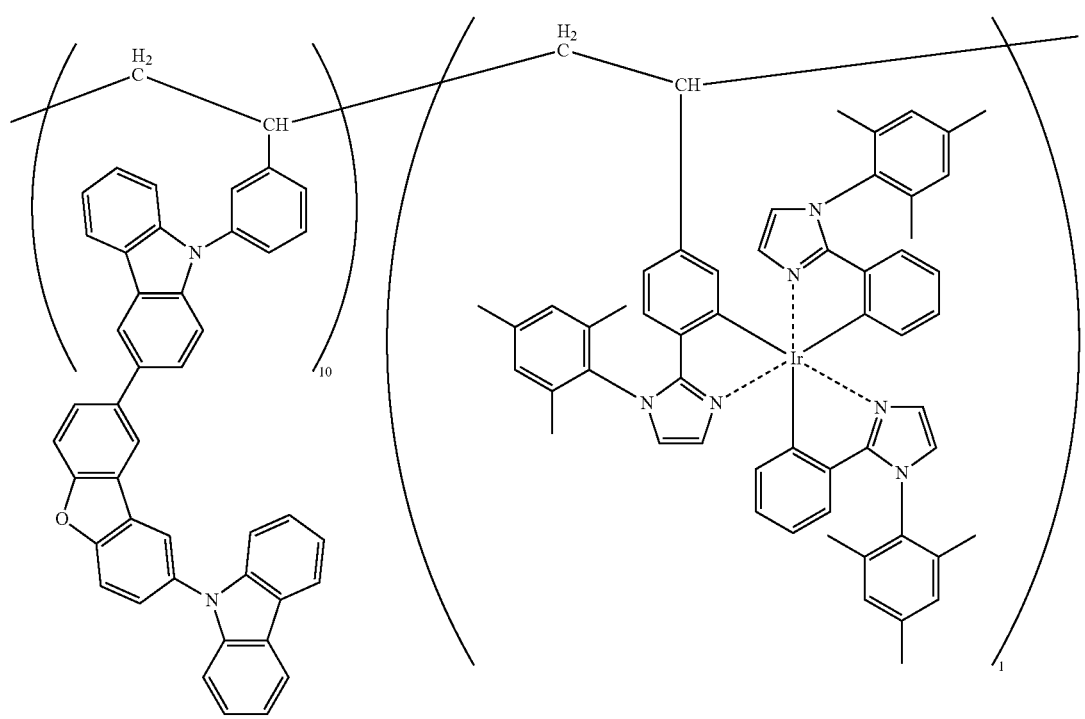
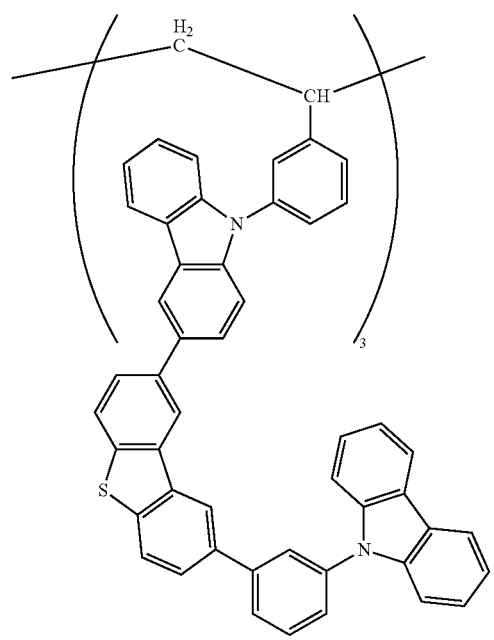

-continued
Host-42
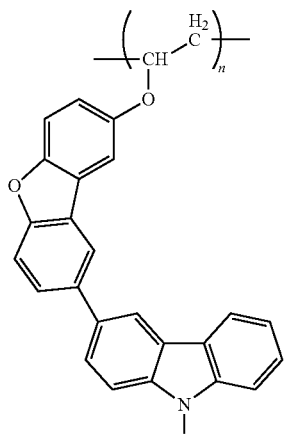
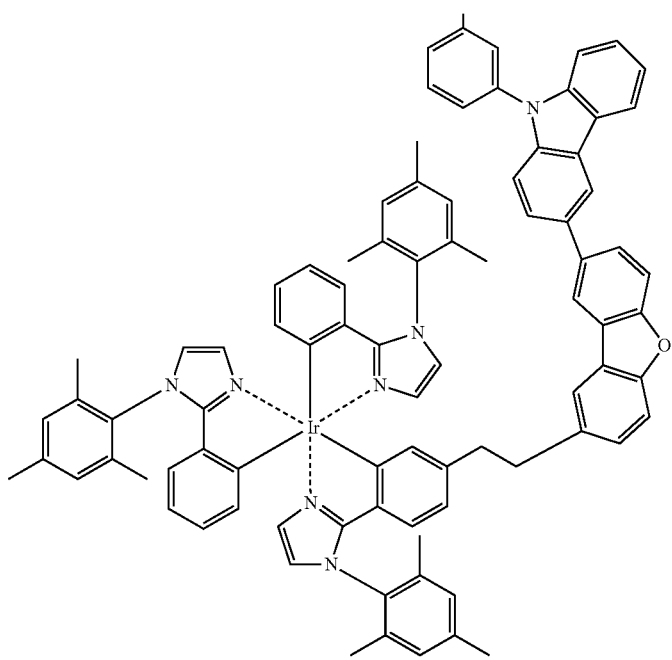
Mw (weight average molecular weight) = 40,0000
Host-43
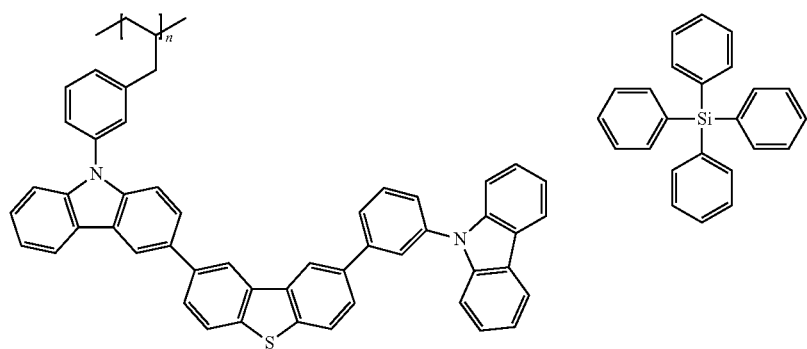
Mw (weight average molecular weight) = 100,000
Host-44

-continued
Host-45
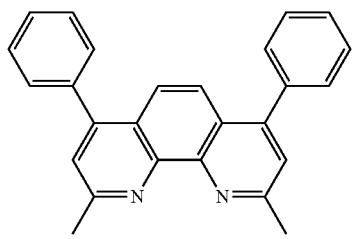
Host-46
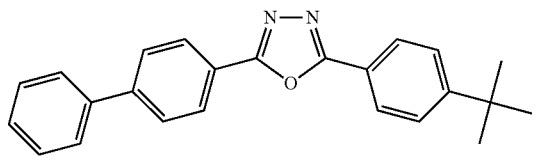
Host-47
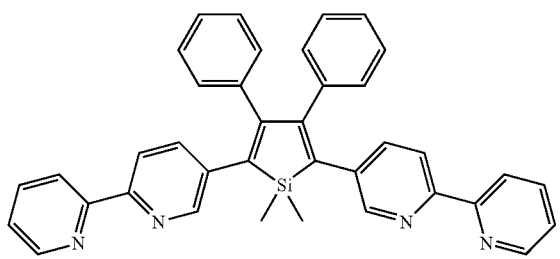
Host-48
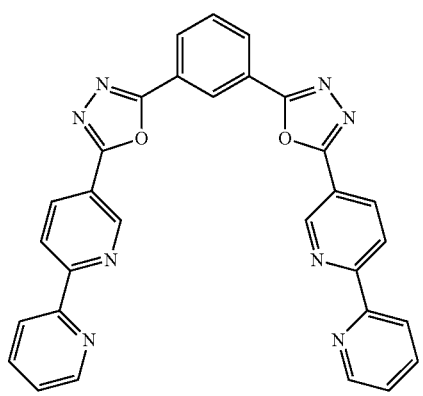
Host-49
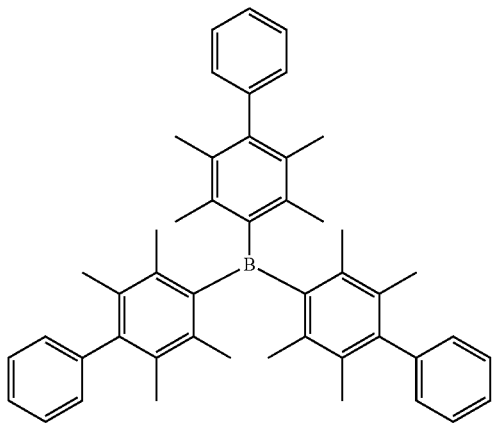
Host-50
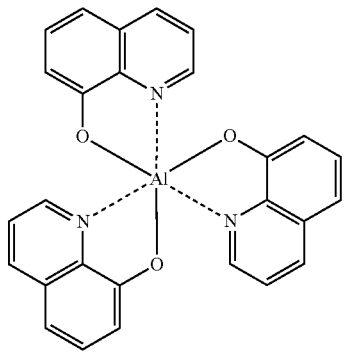
Host-51
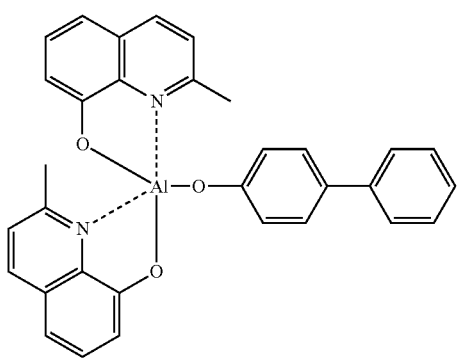
<Anode>
As an anode according to an organic EL element of the present invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. Alternatively, when coatable materials such as organic electrically conductive compounds are employed, it is possible to employ a wet system filming method such as a printing system or a coating system. When emission is taken out of this anode, the transmittance is preferably set to be not less than 10% and the sheet resistance as an anode is preferably not more than a few hundreds Ω/□. Further, although the layer thickness depends on a material, it is generally selected in the range of 10 nm to 1,000 nm and preferably selected in the range of 10 nm to 200 nm.

<Cathode>

On the other hand, as a cathode according to the present invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/Indium mixture, an aluminum/aluminum oxide ($Al_2O_3$) mixture and a lithium/aluminum mixture, and aluminum. A cathode can be prepared by forming a thin layer of these electrode substances with a method such as evaporation or sputtering. Further, the sheet resistance as a cathode is preferably not more than a few hundreds Ω/□ and the layer thickness is generally selected in the range of 10 nm to 5 μm and preferably of 50 nm to 200 nm. In order to make transmit emitted light, either one of an anode or a cathode of an organic EL element is preferably transparent or translucent to improve the emission luminance.

Further, after forming, on the cathode, the above metals at a film thickness of 1 nm to 20 nm, it is possible to prepare a transparent or translucent cathode in such a manner that electrically conductive transparent materials are prepared thereon. By applying the above, it is possible to produce an element in which both anode and cathode are transparent.

<Substrate>

A substrate according to an organic EL element of the present invention is not specifically limited with respect to types of such as glass and plastics. They me be transparent or opaque. A transparent substrate is preferable when the emitting light is taken from the side of substrate. Substrates preferably utilized includes such as glass, quartz and transparent resin film A specifically preferable substrate is a resin film capable of providing an organic EL element with a flexible property.

Examples of a resin film includes: polyesters such as polyethylene terephthalate (PET) and polyethylene naphthalate (PEN); polyethylene, polypropyrene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefine resins such as ARTON (produced by JSR Co. Ltd.) and APEL (produce by Mitsui Chemicals, Inc.)

On the surface of a resin film, it may be formed a film incorporating an inorganic or an organic compound or a hybrid film incorporating both compounds. It is preferable to be a barrier film having a water vapor permeability of at most 0.01 g/($m^2$·24 h) (25±0.5° C., and relative humidity (90±2)% RH) determined based on JIS K 7129-1992. Further, it is preferable to be a high barrier film having an oxygen permeability of at most $10^{-3}$ $cm^3$/($m^2$·24 h·MPa) determined based on JIS K 7126-1987, and having a water vapor permeability of at most $10^{-3}$ g/($m^2$·24 h). It is more preferable that the aforesaid water vapor permeability is not more than $10^{-5}$ g/($m^2$·24 h).

As materials forming a barrier film, employed may be those which retard penetration of moisture and oxygen, which deteriorate the element For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel, films, opaque resin substrates, and ceramic substrates.

The external extraction efficiency of light emitted by the organic EL element of the present invention is preferably 1% or more at room temperature, but is more preferably 5% or more. External extraction quantum yield (%)=(the number of photons emitted by the organic EL element to the exterior/the number of electrons fed to organic EL element)×100

Further, even by simultaneously employing color hue improving filters such as a color filter, simultaneously employed may be color conversion filters which convert emitted light color from the organic EL element to multicolor by employing fluorescent materials. When the color conversion filters are employed, it is preferable that λmax of light emitted by the organic EL element is 480 nm or less.

<Sealing>

As sealing means employed in the present invention, listed may be, for example, a method in which sealing members, electrodes, and a supporting substrate are subjected to adhesion via adhesives.

The sealing members may be arranged to cover the display region of an organic EL element, and may be an engraved plate or a flat plate. Neither transparency nor electrical insulation is limited.

Specifically listed are glass plates, polymer plate-films, metal plates, and films. Specifically, it is possible to list, as glass plates, soda-lime glass, barium-strontium containing glass, lead glass, aluminosilicate glass, borosilicate glass, barium borosilicate glass, and quartz. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible to convert the element to a thin film, it is possible to preferably employ a metal film. Further, the oxygen permeability of the polymer film is preferably at most $1 \times 10^{-3}$ cm$^3$/(m$^2 \cdot$24 h·MPa), determined by the method based on JIS K 7126-1987, while its water vapor permeability (at 25±0.5° C. and relative humidity (90±2)%) is at most $1 \times 10^{-3}$ g/(m$^2 \cdot$24 h), determined by the method based on JIS K 7129-1992.

Conversion of the sealing member into concave is carried out employing a sand blast process or a chemical etching process.

In practice, as adhesives, there can be listed photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones. Still further listed maybe hot-melt type polyamides, polyesters, and polyolefins. Yet further listed may be canonically curable type ultraviolet radiation curable type epoxy resin adhesives.

In addition, since an organic EL element is occasionally deteriorated via a thermal process, those are preferred which enable adhesion and curing between room temperature and 80° C. Further, desiccating agents may be dispersed into the aforesaid adhesives. Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film. In this case, as materials forming the aforesaid film may be those which exhibit functions to retard penetration of those such as moisture or oxygen which results in deterioration. For example, it is possible to employ silicon oxide, silicon dioxide, and silicon nitride. Still further, in order to improve brittleness of the aforesaid film, it is preferable that a laminated layer structure is formed, which is composed of these inorganic layers and layers composed of organic materials. Methods to form these films are not particularly limited. It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

It is preferable to inject inert gases such as nitrogen or argon, and inactive liquids such as fluorinated hydrocarbon or silicone oil into the space between the sealing member and the surface region of the organic EL element by using a gas phase or a liquid phase. Further, it is possible to form vacuum. Still further, it is possible to enclose hygroscopic compounds in the interior.

Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

<Protective Film and Protective Plate>

The aforesaid sealing film on the side which nips the organic layer and faces the support substrate or on the outside of the aforesaid sealing film, a protective or a protective plate may be arranged to enhance the mechanical strength of the element Specifically, when sealing is achieved via the aforesaid sealing film, the resulting mechanical strength is not always high enough, whereby it is preferable to arrange the protective film or the protective plate described above. Usable materials for these include glass plates, polymer plate-films, and metal plate-films which are similar to those employed for the aforesaid sealing. However, in terms of light weight and a decrease in thickness, it is preferable to employ polymer films <Light Extraction>

It is generally known that an organic EL element emits light in the interior of the layer exhibiting the refractive index (being about 1.7 to about 2.1) which is greater than that of air, whereby only about 15 to about 20% of light generated in the light emitting layer is extracted. This is due to the fact that light incident to an interface (being an interface of a transparent substrate to air) at an angle of θ which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example, a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A No. 63-314795), a method in which a reflection surface is formed on the side of the element (JP-A No. 1-220394), a method in which a flat layer of a middle refractive index is introduced between the substrate and the light emitting body and an antireflection film is formed (JP-A No. 62-172691), a method in which a flat layer of a refractive index which is equal to or less than the substrate is introduced between the substrate and the light emitting body (JP-A No. 2001-202827), and a method in which a diffraction grating is formed between the substrate and any of the layers such as the transparent electrode layer or the light emitting layer (including between the substrate and the outside) (JP-A No. 11-283751).

In the present invention, it is possible to employ these methods while combined with the organic EL element of the present invention Of these, it is possible to appropriately employ the method in which a flat layer of a refractive index which is equal to or less than the substrate is introduced between the substrate and the light emitting body and the method in which a diffraction grating is formed between the substrate and any of the layers such as the transparent electrode layer or the light emitting layer (including between the substrate and the outside).

By combining these means, the present invention enables the production of elements which exhibit higher luminance or excel in durability.

When a low refractive index medium of a thickness, which is greater than the wavelength of light, is formed between the transparent electrode and the transparent substrate, the extraction efficiency of light emitted from the transparent electrode to the exterior increases as the refractive index of the medium decreases.

As materials of the low refractive index layer, listed are, for example, aerogel, porous silica, magnesium fluoride, and fluorine based polymers. Since the refractive index of the transparent substrate is commonly about 1.5 to about 1.7, the refractive index of the low refractive index layer is preferably at most approximately 1.5, but is more preferably at most 1.35.

Further, thickness of the low refractive index medium is preferably at least two times the wavelength in the medium. The reason is that when the thickness of the low refractive index medium reaches nearly the wavelength of light so that electromagnetic waves oozed via evernescent enter into the substrate, effects of the low refractive index layer are lowered.

The method in which the interface which results in total reflection or a diffraction grating is introduced in any of the media is characterized in that light extraction efficiency is significantly enhanced.

The above method works as follows. By utilizing properties of the diffraction grating capable of changing the light direction to the specific direction different from diffraction via so-called Bragg diffraction such as primary diffraction or secondary diffraction of the diffraction grating, of light emitted from the light emitting layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic re active index. The reason is as follows. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced. However, by changing the refractive index distribution to a two-dimensional one, light, which travels to all directions, is diffracted, whereby the light extraction efficiency is enhanced.

As noted above, a position to introduce a diffraction grating may be between any layers or in a medium (in a transparent substrate or a transparent electrode). However, a position near the organic light emitting layer, where light is generated, is desirous.

In this case, the cycle of the diffraction grating is preferably about ½ to about 3 times the wavelength of light in the medium.

The preferable arrangement of the diffraction grating is such that the arrangement is two-dimensionally repeated in the form of a square lattice, a triangular lattice, or a honeycomb lattice.

<Light Collection Sheet>

Via a process to arrange a structure such as a micro-lens array shape on the light extraction side of the organic EL element of the present invention or via combination with a so-called light collection sheet, light is collected in the specific direction such as the front direction with respect to the light emitting element surface, whereby it is possible to enhance luminance in the specific direction.

In an example of the micro-lens array, square pyramids to realize a side length of 30 µm and an apex angle of 90 degrees are two-dimensionally arranged on the light extraction side of the substrate. The side length is preferably 10 µm to 100 µm. When it is less than the lower limit, it will be colored due to generation of diffraction effects, while when it exceeds the upper limit, the thickness increases undesirably.

It is possible to employ, as a light collection sheet, for example, one which is put into practical use in the LED backlight of liquid crystal display devices. It is possible to employ, as such a sheet for example, the luminance enhancing film (BEF), produced by Sumitomo 3M Limited. As shapes of a prism sheet employed may be, for example. A shaped stripes of an apex angle of 90 degrees and a pitch of 50 µm formed on a base material, a shape in which the apex angle is rounded, a shape in which the pitch is randomly changed, and other shapes.

Further, in order to control the light radiation angle from the light emitting element, simultaneously employed may be a light diffusion plate-film. For example, it is possible to employ the diffusion film (LIGHT-UP), produced by Kimoto Co., Ltd.

<Preparation Method of Organic EL Element>

As one example of the preparation method of the organic EL element of the present invention, the preparation method of the organic EL element composed of anode/hole injection layer/hole transport layer/light emitting layer/electron transport layer/electron injection layer/cathode will be described.

Initially, a thin film composed of desired electrode substances, for example, anode substances is formed on an appropriate base material to reach a thickness of at most 1 µm but preferably 10 nm to 200 nm, employing a method such as vapor deposition or sputtering, whereby an anode is prepared.

Subsequently, on the above, formed are organic compound thin layers including a hole injection layer, a hole transport layer, a light emitting layer, a hole blocking layer, an electron transport layer, and an electron injection layer, which are organic EL element materials.

Methods to form each of these layers include, as described above, a vapor deposition method and a wet process (a spin coating method, a casting method, an ink-jet method, and a printing method). In the present invention, in view of easy formation of a homogeneous film and rare formation of pin holes, preferred is film formation via the coating method such as the spin coating method, the ink-jet method, or the printing method.

As liquid media which are employed to dissolve or disperse organic metal complexes according to the present invention, employed may be, for example, ketones such as methyl ethyl ketone or cyclohexanone, fatty acid esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decaline, and dodecane, and organic solvents such as DMF or DMSO. Further, with regard to dispersion methods, it is possible to achieve dispersion employing dispersion methods such as ultrasonic waves, high shearing force dispersion or media dispersion.

After forming these layers, a thin layer composed of cathode materials is formed on the above layers via a method such as vapor deposition or sputtering so that the film thickness reaches at most 1 µm, but is preferably in the range of 50 nm to 200 nm, whereby a cathode is arranged, and the desired organic EL element is prepared.

Further, by reversing the preparation order, it is possible to achieve preparation in order of a cathode, an electron injection layer, an electron transport layer, a light emitting layer, a hole transport layer, a hole injection layer, and an anode. When direct current voltage is applied to the multicolor display device prepared as above, the anode is employed as + polarity, while the cathode is employed as − polarity. When 2-40 V is applied, it is possible to observe light emission. Further, alternating current voltage may be applied. The wave form of applied alternating current voltage is not specified.

<Application>

It is possible to employ the organic EL element of the present invention as display devices, displays, and various types of light emitting sources. Examples of light emitting sources include, but are not limited to lighting apparatuses (home lighting and car lighting), clocks, backlights for liquid crystals, sign advertisements, signals, light sources of light memory media, light sources of electrophotographic copiers, light sources of light communication processors, and light sources of light sensors. It is effectively employed especially as backlights of liquid crystal display devices and lighting sources.

If needed, the organic EL element of the present invention may undergo patterning via a metal mask or an ink-jet printing method during film formation. When the patterning is carried out, only an electrode may undergo patterning, an electrode and a light emitting layer may undergo patterning, or all element layers may undergo patterning. During preparation of the element, it is possible to employ conventional methods.

Color of light emitted by the organic EL element of the present invention and compounds according to the present invention is specified as follows. In FIG. 4.16 on page 108 of "Shinpen Shikisai Kagaku Handbook (New Edition Color Science Handbook)" (edited by The Color Science Association of Japan, Tokyo Daigaku Shuppan Kai, 1985), values determined via a spectroradiometric luminance meter CS-1000 (produced by Konica Minolta Sensing Inc.) are applied to the CIE chromaticity coordinate, whereby the color is specified.

Further, when the organic EL element of the present invention is a white element, "white", as described herein, means that when 2-degree viewing angle front luminance is determined via the aforesaid method, chromaticity at 1,000 cd/m$^2$ in the CIE 1931 Color Specification System is within the region of X=0.35±0.07 and Y=0.35±0.1.

EXAMPLES

The present invention will now be described with reference to examples, however the present invention is not limited thereto. The chemical structures of the compounds used in Examples are shown in the followings. The indication of "%" is used in Examples. Unless specifically notice, this indicates "mass %".

Example 1

<Preparation of Organic EL Element 1>

An anode was prepared by making patterning to a glass substrate (NA-45 produced by NH Techno Glass Corp.) on which a 100 nm film of ITO (indium tin oxide) was formed. Thereafter, the above transparent support substrate provided with the ITO transparent electrode was subjected to ultrasonic washing with isopropyl alcohol, followed by drying with desiccated nitrogen gas, and was subjected to UV ozone washing for 5 minutes.

On the transparent support substrate thus prepared was applied a 50% solution of poly(3,4-ethylenedioxythiphene)-polystyrene sulfonate (PEDOT/PSS, Baytron P AI 4083 made by Bayer AG.) diluted with water by using a spin coating method at 3,000 rpm for 30 seconds to form a film and then it was dried at 180° C. for 30 minutes. A hole injection layer having a thickness of 20 nm was prepared.

The aforesaid substrate was transferred under an atmosphere of nitrogen, and a 0.5% solution of compound 50a (weight average molecular weight of 5,000) dissolved in chlorobenzene was applied on the aforesaid hole injection layer by using a spin coating method at 1,500 rpm for 30 seconds to form a film. The film was dried at 160° C. for 30 minutes to obtain a hole transport layer having a thickness of 30 nm.

Further, the light emitting layer composition having the following constitution was applied on the aforesaid hole transport layer by using a spin coating method at 1,500 rpm for 30 seconds to form a film. The film was dried at 120° C. for 30 minutes to obtain a light emitting layer having a thickness of 50 nm.

(Light Emitting Layer Composition)

| H-A | 22.4 mass parts |
|---|---|
| Ir-16 | 2.5 mass parts |
| Ir-1 | 0.05 mass parts |
| Ir-4 | 0.05 mass parts |
| Butyl acetate | 2,000 mass parts |

Then, a solution containing 30 mg of ET-A dissolved in 4 ml of tetrafluoropropanol (TFPO) was applied by using a spin coating method at 1,500 rpm for 30 seconds to form a film. The film was dried at 120° C. for 30 minutes to obtain an electron transport layer having a thickness of 30 nm.

Next, the substrate was transferred into a vapor deposition apparatus without being exposed to the air. A molybdenum resistance heating boat loaded with KF was installed in a vapor deposition apparatus. After the pressure of the vacuum chamber was reduced to 4×10$^{-5}$ Pa, the aforesaid heating boat was heated via application of electric current and KF was deposited at a rate of 0.02 nm/second onto the aforesaid electron transport layer to form an electron injection layer having a thickness of 2 nm. Then, 100 nm of aluminium was vapor deposited to form a cathode. Thus organic EL element 1 was prepared.

<Preparation of Organic EL Elements 2 to 10>

Organic EL elements 2 to 10 each were prepared in the same manner as preparation of Organic EL element 1 except that the density of the hole injection layer coating solution, the kind of the hole transport materials (50b to 50e having a different weight average molecular weight), the density of the hole transport layer coating solution, the dopant in the light emitting layer, the layer thickness of the hole injection layer (T1) and the layer thickness of the hole transport layer (T2) were changed as described in Table 1.

H-A
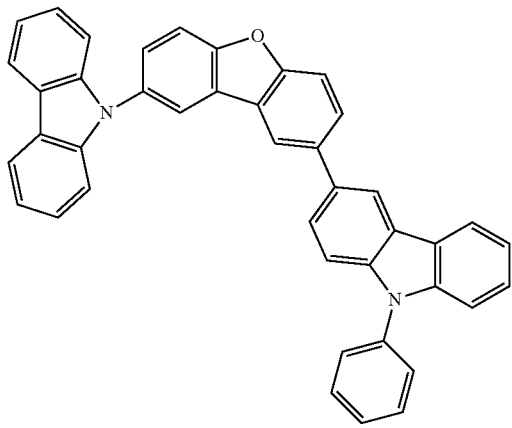

Ir-A
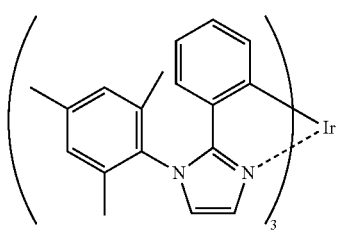

ET-A
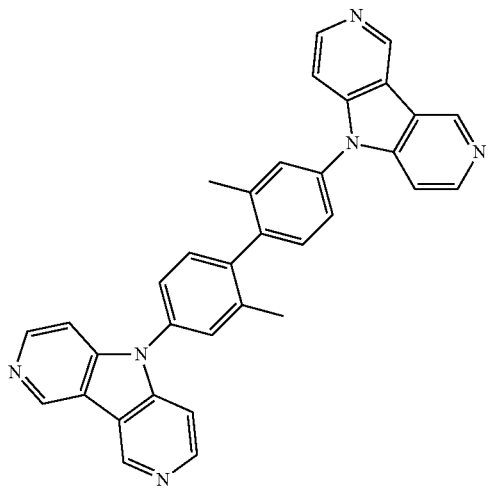

<Evaluation of Organic EL Elements>

Evaluations of Organic EL elements 1-1 to 1-4 were carried out as follows. The non-light emitting surface of the prepared organic EL element was covered with a glass case, and a 300 μm thick glass substrate was employed as a sealing substrate. An epoxy based light curable type adhesive (LUX-TRACK LC0629B produced by Toagosei Co., Ltd.) was employed in the periphery as a sealing material. The resulting one was superimposed on the aforesaid cathode to be brought into close contact with the aforesaid transparent support substrate, and curing and sealing were carried out via exposure of UV radiation onto the glass substrate side, whereby the lighting device shown in FIGS. 1 and 2 was formed.

Figure 2:
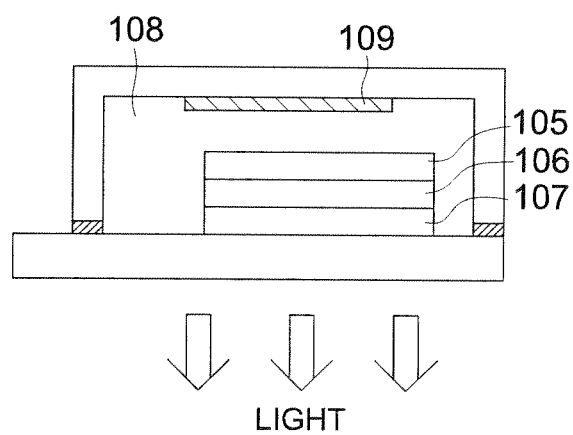
FIG. 2 is a schematic drawing of a lighting device.

FIG. 1 is a schematic view of a lighting device and Organic EL element 101 is covered with glass cover 102 (incidentally, sealing by the glass cover was carried out in a globe box under nitrogen ambience (under an ambience of high purity nitrogen gas at a purity of 99.999% or more) so that Organic EL Element 101 was not brought into contact with atmosphere. FIG. 2 is a cross-sectional view of a lighting device, and in FIG. 2, 105 represents a cathode, 106 represents an organic EL layer, and 107 represents a glass substrate fitted with a transparent electrode. Further, the interior of glass cover 102 is filled with nitrogen gas 108 and water catching agent 109 is provided.

(External Extraction Quantum Efficiency, Driving Voltage and Emission Spectrum)

Each organic EL element was allowed to emit a light under a constant luminance condition of 1,000 cd/m² at room temperature (at about 23° C. to 25° C.). The external extraction quantum efficiency (η), driving voltage and emission spectrum were determined. The measurement of luminance was done with a spectroradiometric luminance meter CS-1000 (produced by Konica Minolta Sensing Inc.). The external extraction quantum efficiency and driving voltage each was represented by the relative value when the value of Organic EL element 2 was set to be 100.

(Emission Lifetime)

Each organic EL element was driven under a constant luminance condition of 1,000 cd/m² at room temperature so as to continuously emit a light. The time required for a decease in one half of the initial luminance was determined, and obtained a value of a half lifetime ($\tau_{1/2}$). The emission lifetime was represented as a relative value when the lifetime of Organic EL element 2 was set to be 100.

(Rectification Ratio)

Each organic EL element was driven at room temperature with a forward voltage which flew an electric current of 500

TABLE 1

| Organic EL element No. | Hole injection layer Material | Density (%) | Hole transport layer Material | Weight average molecular weight | Density (%) | Electron transport layer, Solvent | Dopant in Light emitting layer | T1 (nm) | T2 (nm) | Remarks |
|---|---|---|---|---|---|---|---|---|---|---|
| 1 | PEDOT/PSS | 50 | 50a | 5,000 | 0.75 | TFPO | Ir-16 | 20 | 30 | Comparison |
| 2 | PEDOT/PSS | 50 | 50b | 30,000 | 0.75 | TFPO | Ir-16 | 20 | 30 | Comparison |
| 3 | PEDOT/PSS | 50 | 50b | 30,000 | 0.75 | Propanol | Ir-16 | 20 | 30 | Comparison |
| 4 | PEDOT/PSS | 75 | 50b | 30,000 | 0.50 | TFPO | Ir-16 | 30 | 20 | Comparison |
| 5 | PEDOT/PSS | 75 | 50b | 30,000 | 0.50 | TFPO | Ir-A | 30 | 20 | Comparison |
| 6 | PEDOT/PSS | 50 | 50e | 250,000 | 0.75 | TFPO | Ir-16 | 20 | 30 | Comparison |
| 7 | PEDOT/PSS | 50 | 50c | 55,000 | 0.75 | TFPO | Ir-16 | 20 | 30 | Invention |
| 8 | PEDOT/PSS | 50 | 50d | 80,000 | 0.75 | TFPO | Ir-16 | 20 | 30 | Invention |
| 9 | PEDOT/PSS | 75 | 50d | 80,000 | 0.50 | TFPO | Ir-16 | 30 | 20 | Invention |
| 10 | PEDOT/PSS | 75 | 50d | 80,000 | 0.50 | TFPO | Ir-A | 30 | 20 | Invention |

A/cm². And from an electric current value with its reverse voltage, the rectification ratio was calculated. The evaluation criteria were as follows. When the rectification ratio was 100 or more, it was designates as "good"; and when the rectification ratio was less than 100, it was designates as "not good".

The obtained results are shown n Table 2.

TABLE 2

| Organic EL element | Rectification ratio | Maximum emission wavelength (nm) | Minimum emission in 480 to 510 nm | External extraction quantum efficiency (relative value) | Emission lifetime (relative value) | Driving voltage (relative value) | Remarks |
|---|---|---|---|---|---|---|---|
| 1 | Not good | 458/505/515/622 | No | 32 | 22 | 184 | Comparison |
| 2 | Good | 458/505/515/622 | No | 100 | 100 | 100 | Comparison |
| 3 | Not good | 458/505/515/622 | No | 63 | 54 | 154 | Comparison |
| 4 | Good | 458/505/515/622 | No | 103 | 108 | 98 | Comparison |
| 5 | Good | 473/505/515/622 | Yes | 108 | 116 | 97 | Comparison |
| 6 | Good | 458/505/515/622 | No | 104 | 110 | 112 | Comparison |
| 7 | Good | 458/505/515/622 | No | 113 | 132 | 95 | Invention |
| 8 | Good | 458/505/515/622 | No | 129 | 153 | 92 | Invention |
| 9 | Good | 458/505/515/622 | No | 133 | 161 | 93 | Invention |
| 10 | Good | 473/505/515/622 | Yes | 147 | 176 | 88 | Invention |

From the results shown in Table 2, it is found that the rectification ratio was not good and film formation was not performed well when the weight average molecular weight of the hole transport layer material is as low as 5,000. Although film formation was performed well when the weight average molecular weight was 30,000, the external extraction quantum efficiency and the emission lifetime were largely improved and the driving voltage was decreased to a large extent by using the material having the weight average molecular weight of 50,000 or more. Further, it is found that the driving voltage was increased when the weight average molecular weight was larger than 200,000.

DESCRIPTION OF SYMBOLS

101: organic EL element
102: glass cover
105: cathode
106: organic EL layer
107: glass substrate having a transparent electrode
108: nitrogen gas
109: water catching agent

The invention claimed is:

1. An organic electroluminescence element comprising a substrate having thereon at least an anode, a cathode and a laminated layer structure sandwiched between the anode and the cathode, wherein the laminated layer structure comprises at least four layers produced by a wet process, and a hole injection layer, a hole transport layer and a light emitting layer are contained in the at least four layers produced by the wet process,
wherein the hole injection layer contains a conductive polymer, the hole transport layer contains a polymer having a repeating unit represented by Formula (1), and the polymer has a weight average molecular weight of 55,000 to 80,000 as a polystyrene conversion value,

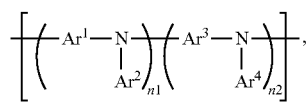

Formula (1)

wherein $Ar^1$ and $Ar^3$ each independently represent an unsubstituted or substituted arylene group which is selected from the group consisting of a phenylene group, a biphenylene group and two phenylene groups conneted by a spacer group, the spacer group is selected from the group consisting of

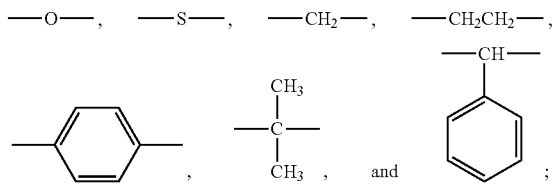

$Ar^2$ and $Ar^4$ each independently represent an aryl group or an aromatic heterocyclic group which is unsubstituded or substituted with a substituent selected from the group consisting of an aryl group and an alkoxy group; n1 and n2 are integer of 0 to 2, provided that n1 and n2 are not simultaneously 0.

2. The organic electroluminescence element of claim 1, wherein a thickness T1 of the hole injection layer and a thickness T2 of the hole transport layer satisfy the following expression:

T1>T2.

3. The organic electroluminescence element of claim 1, wherein the light emitting layer contains a plurality of light emitting materials each having a different emitting light color, the plurality of light emitting materials have a light emission spectrum exhibiting at least two maximum emissions in the range of 420 to 650 nm and one minimum emission in the range of 480 to 510 nm.

4. The organic electroluminescence element of claim 1, wherein the light emitting material contained in the light emitting layer has a molecular weight of 3,000 or less.

5. The organic electroluminescence element of claim 1, wherein the light emitting material contained in the light emitting layer is a compound having at least one partial structure represented by any one of Formulas (3) to (5):

Formula (3)

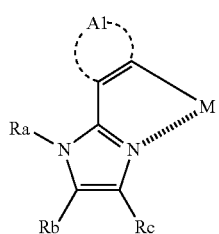

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

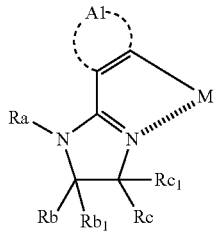

Formula (4)

wherein Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

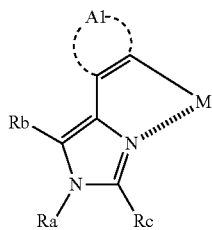

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

6. The organic electroluminescence element of claim 1, wherein a fluorinated alcohol is used in the step of forming the hole transport layer by a wet process.

7. The organic electroluminescence element of claim 2, wherein the light emitting layer contains a plurality of light emitting materials each having a different emitting light color, the plurality of light emitting materials have a light emission spectrum exhibiting at least two maximum emissions in the range of 420 to 650 nm and one minimum emission in the range of 480 to 510 nm.

8. The organic electroluminescence element of claim 2, wherein the light emitting material contained in the light emitting layer has a molecular weight of 3,000 or less.

9. The organic electroluminescence element of claim 3, wherein the light emitting material contained in the light emitting layer has a molecular weight of 3,000 or less.

10. The organic electroluminescence element of claim 7, wherein the light emitting material contained in the light emitting layer has a molecular weight of 3,000 or less.

11. The organic electroluminescence element of claim 2, wherein the light emitting material contained in the light emitting layer is a compound having at least one partial structure represented by any one of Formulas (3) to (5):

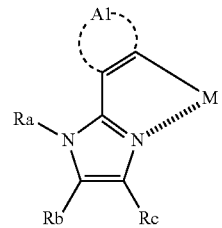

Formula (3)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

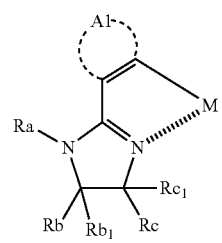

Formula (4)

wherein Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

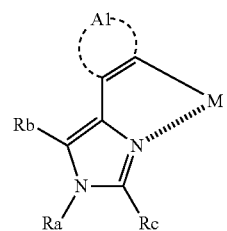

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

12. The organic electroluminescence element of claim 3, wherein the light emitting material contained in the light emitting layer is a compound having at least one partial structure represented by any one of Formulas (3) to (5):

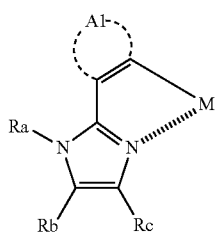

Formula (3)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

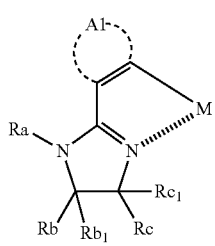

Formula (4)

wherein Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

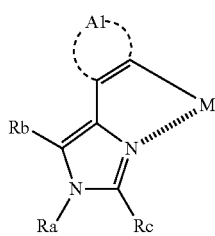

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

13. The organic electroluminescence element of claim 4, wherein the light emitting material contained in the light emitting layer is a compound having at least one partial structure represented by any one of Formulas (3) to (5):

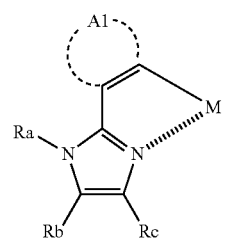

Formula (3)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

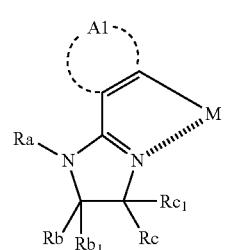

Formula (4)

wherein Ra represents a hydrogen atom, an aliphatic group an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

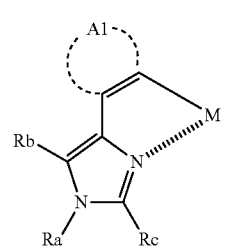

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

14. The organic electroluminescence element of claim 7, wherein the light emitting material contained in the light emitting layer is a compound having at least one partial structure represented by any one of Formulas (3) to (5):

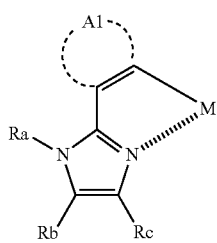

Formula (3)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

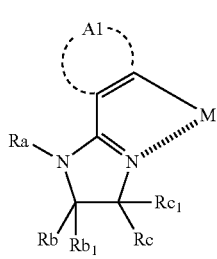

Formula (4)

wherein Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

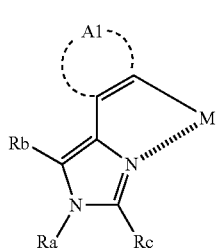

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

15. The organic electroluminescence element of claim 8, wherein the light emitting material contained in the light emitting layer is a compound having at least one partial structure represented by any one of Formulas (3) to (5):

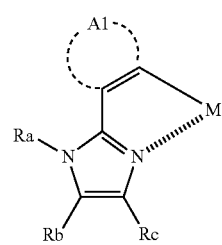

Formula (3)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

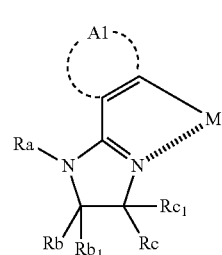

Formula (4)

wherein Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

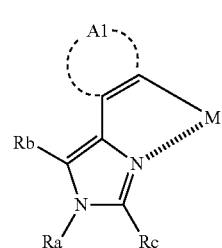

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

16. The organic electroluminescence element of claim 9, wherein the light emitting material contained in the light emitting layer is a compound having at least one partial structure represented by any one of Formulas (3) to (5):

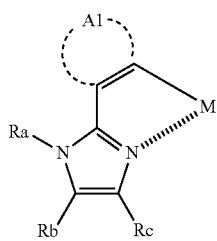

Formula (3)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

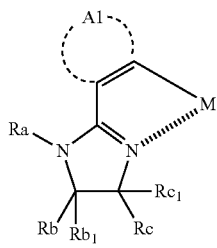

Formula (4)

wherein Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

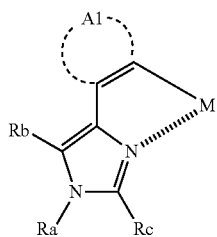

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

17. The organic electroluminescence element of claim 10, wherein the light emitting material contained in the light emitting layer is a compound having at least one partial structure represented by any one of Formulas (3) to (5):

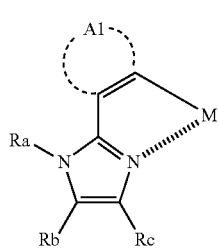

Formula (3)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt,

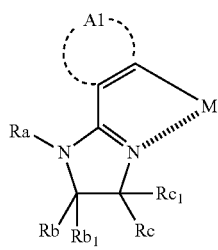

Formula (4)

wherein Ra represents a hydrogen atom, an aliphatic group, an aromatic hydrocarbon group or an aromatic heterocyclic group; Rb, Rc, $Rb_1$ and $Rc_1$ each represents a hydrogen atom or a substituent; A1 represents a group of atoms necessary to form an aromatic hydrocarbon ring or an aromatic heterocycle; and M represents Ir or Pt,

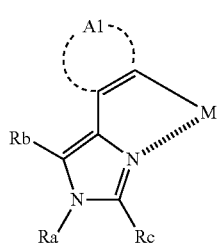

Formula (5)

wherein Ra represents a hydrogen atom, an aliphatic group, an aromatic hydrocarbon group or an aromatic heterocyclic group; Rb and Rc each represents a hydrogen atom or a substituent; A1 represents a group of atoms necessary to form an aromatic hydrocarbon ring or an aromatic heterocycle; and M represents Ir or Pt.

18. The organic electroluminescence element of claim 2, wherein a fluorinated alcohol is used in the step of forming the hole transport layer by a wet process.

19. The organic electroluminescence element of claim 3, wherein a fluorinated alcohol is used in the step of forming the hole transport layer by a wet process.

20. The organic electroluminescence element of claim 5, wherein a fluorinated alcohol is used in the step of forming the hole transport layer by a wet process.

* * * * *